United States Patent
Thomas et al.

(10) Patent No.: US 12,348,193 B2
(45) Date of Patent: Jul. 1, 2025

(54) OPEN LOOP PROCESS AND TEMPERATURE INDEPENDENT BIAS CIRCUIT FOR STACKED DEVICE AMPLIFIERS

(71) Applicant: The Boeing Company, Chicago, IL (US)

(72) Inventors: Chris M. Thomas, Playa Vista, CA (US); Brian K. Kormanyos, Edmonds, WA (US)

(73) Assignee: The Boeing Company, Arlington, VA (US)

( * ) Notice: Subject to any disclaimer, the term of this patent is extended or adjusted under 35 U.S.C. 154(b) by 682 days.

(21) Appl. No.: 17/695,639

(22) Filed: Mar. 15, 2022

(65) Prior Publication Data

US 2022/0302881 A1 Sep. 22, 2022

Related U.S. Application Data

(60) Provisional application No. 63/163,647, filed on Mar. 19, 2021.

(51) Int. Cl.
  *H03F 1/02* (2006.01)
  *H03F 1/22* (2006.01)
  *H03F 1/30* (2006.01)

(52) U.S. Cl.
  CPC ........... *H03F 1/301* (2013.01); *H03F 1/0211* (2013.01); *H03F 1/223* (2013.01); *H03F 1/302* (2013.01); *H03F 2200/447* (2013.01); *H03F 2200/555* (2013.01)

(58) Field of Classification Search
  CPC .................................. H03F 1/02; H03F 1/07
  USPC ............................................. 330/124 R, 295
  See application file for complete search history.

(56) References Cited

PUBLICATIONS

Schellenberg, James, "High-efficiency, packaged Ka-band MMIC operating at 24 volts," IEEE MTT-S Digest, 1998, pp. 577-580, vol. 2., Baltimore, MD, USA.
Datta Kunal et al., "Performance Limits, Design and Implementation of mm-Wave SiGe HBT Class-E and Stacked Class-E Power Amplifiers," IEEE Journal of Solid-State Circuits, Oct. 2014, pp. 2150-2171, vol. 49, No. 10.

*Primary Examiner* — Henry Choe
(74) *Attorney, Agent, or Firm* — Harrity & Harrity, LLP

(57) ABSTRACT

An open loop process and temperature independent bias circuit for stacked device amplifiers is disclosed herein. In one or more embodiments, a method for biasing a stacked high-voltage signal amplifier with a voltage divider bias module comprises generating, by the voltage divider bias module from a power supply voltage (VDD), a plurality of control voltage biases, which comprise a plurality of voltage references plus an offset voltage term (Vtemp). In one or more embodiments, the plurality of voltage references are each proportional to a division of the power supply voltage (VDD), and the offset voltage term (Vtemp) is proportional to temperature and is a function of process variation. The method further comprises biasing, a plurality of devices of the stacked high-voltage signal amplifier, with the control voltage biases.

15 Claims, 24 Drawing Sheets

BIAS CIRCUIT FOR 3 STACK DEVICE POWER AMPLIFIER (PA)
1400

OPEN LOOP PROCESS AND TEMPERATURE INDEPENDENT BIAS CIRCUIT FOR STACKED DEVICE AMPLIFIERS

CROSS-REFERENCE TO RELATED APPLICATION

This application claims priority to U.S. Provisional Patent Application No. 63/163,647, filed Mar. 19, 2021, which is incorporated by reference herein in its entirety.

FIELD

The present disclosure relates to bias circuits. In particular, the present disclosure relates to an open loop process and temperature independent bias circuit for stacked device amplifiers.

BACKGROUND

Currently, there are various approaches to biasing stacked device amplifiers, which are known both academically and commercially. Both "open loop" bias circuit designs (e.g., refer to the conventional amplifiers 100, 200 shown in FIGS. 1A and 2) and "closed loop" bias circuit designs have been employed. Simple resistive divider biasing networks, while being "open loop" with no feedback and inherently stable, do not exhibit performance independent of process and temperature variation. "Closed loop" bias circuits with feedback, while may provide the regulation of the voltage supply across each stacked device of the amplifier as well as temperature stability, have bias networks that can be potentially unstable. In addition, "closed loop" feedback often limits the current of the amplifier at a fixed bias, thereby limiting the output power and efficiency.

In light of the foregoing, there is a need for an improved design for a bias circuit for stacked amplifier devices.

SUMMARY

The present disclosure relates to methods, systems, and apparatuses for an open loop process and temperature independent bias circuit for stacked device amplifiers. In one or more embodiments, a method for biasing a stacked high-voltage signal amplifier with a voltage divider bias module comprises generating, by the voltage divider bias module from a power supply voltage (VDD), a plurality of control voltage biases, which comprise a plurality of voltage references plus an offset voltage term (Vtemp). In one or more embodiments, the plurality of voltage references are each proportional to a division of the power supply voltage (VDD), and the offset voltage term (Vtemp) is proportional to temperature and is a function of process variation. The method further comprises biasing, a plurality of devices of the stacked high-voltage signal amplifier, with the control voltage biases.

In one or more embodiments, the voltage divider bias module comprises a plurality of temperature-dependent resistive cells connected together in series and sharing a common direct current (DC). In at least one embodiment, each of the temperature-dependent resistive cells comprises a diode-connected device connected to a resistor in series. In at least one embodiment, the diode-connected device is a transistor or other three-terminal amplifying device. In some embodiments, the transistor is a bipolar junction transistor (BJT) or a complementary metal-oxide semiconductor (CMOS) transistor.

In at least one embodiment, the method further comprises inputting, into the voltage divider bias module, the power supply voltage (VDD).

In one or more embodiments, the offset voltage term (Vtemp) is equal to a base-to-emitter voltage (Vbe) or a gate-to-source voltage (Vgs) for each of the devices of the stacked high-voltage signal amplifier.

In at least one embodiment, the stacked high-voltage signal amplifier comprises a plurality of unit element amplifier cells that are stacked such that the unit element amplifier cells share a common DC current (Idc). In some embodiments, the unit element amplifier cells are connected together in a cascode configuration.

In one or more embodiments, the stacked high-voltage signal amplifier comprises at least one stage.

In at least one embodiment, each unit element amplifier cell comprises a transistor or other three-terminal amplifying device. In some embodiments, the transistor is a bipolar junction transistor (BJT) or a complementary metal-oxide semiconductor (CMOS) transistor.

In one or more embodiments, the devices in the stacked high-voltage signal amplifier comprise a same temperature coefficient of a threshold voltage as devices in the voltage divider bias module. In some embodiments, the devices in the stacked high-voltage signal amplifier are of a same type with a same current density as devices in the voltage divider bias module.

In at least one embodiment, the method further comprises setting, by a bias current reference, a common DC current (Idc) flowing through the stacked high-voltage signal amplifier. In some embodiments, the bias current reference is a variable bias current reference.

In one or more embodiments, a method for biasing a stacked high-voltage signal amplifier with a voltage divider bias module comprises generating, by the voltage divider bias module from a power supply voltage (VDD), a plurality of control voltage biases, which comprise a plurality of voltage references plus an offset voltage term (Vtemp). In one or more embodiments, the plurality of voltage references are each proportional to a division of the power supply voltage (VDD), and the offset voltage term (Vtemp) is proportional to temperature and is a function of process variation. The method further comprises receiving, by a voltage buffer module, the control voltage biases. Also, the method comprises generating, by the voltage buffer module, a low impedance output from a high impedance input. In addition, the method comprises outputting, by the voltage buffer module, the control voltage biases. Further, the method comprises biasing, a plurality of devices of the stacked high-voltage signal amplifier, with the control voltage biases.

In at least one embodiment, the voltage buffer module comprises a plurality of unity-gain buffers. In some embodiments, the unity-gain buffers are operational amplifiers (op-amps). In one or more embodiments, the op-amps are configured in a voltage follower configuration.

In one or more embodiments, the voltage buffer module comprises a voltage follower module cascaded with a level shifter module. In some embodiments, the voltage follower module and the level shifter module comprise devices that are scaled such that an additional offset voltage term (Vtemp) generated by the voltage follower module is canceled out by the level shifter module.

In at least one embodiment, a method for generating equal division of a voltage with a voltage divider module comprises generating, by the voltage divider module from the voltage, a plurality of divider voltages, which comprise a plurality of voltage references plus an offset voltage term (Vtemp). In one or more embodiments, the plurality of voltage references are each proportional to a division of the voltage, and wherein the offset voltage term (Vtemp) is proportional to temperature and is a function of process variation.

In one or more embodiments, the method further comprises receiving, by a voltage buffer module, the divider voltages. Also, the method comprises generating, by the voltage buffer module, a low impedance output from a high impedance input. Further, the method comprises outputting, by the voltage buffer module, the divider voltages.

In at least one embodiment, the voltage divider module comprises a plurality of temperature-dependent resistive cells connected together in series and sharing a common direct current (DC). In one or more embodiments, each of the temperature-dependent resistive cells comprises a diode-connected device connected to a resistor in series.

In one or more embodiments, a system for biasing a stacked high-voltage signal amplifier with a voltage divider bias module comprises the voltage divider bias module to generate, from a power supply voltage (VDD), a plurality of control voltage biases, which comprise a plurality of voltage references plus an offset voltage term (Vtemp). In one or more embodiments, the plurality of voltage references are each proportional to a division of the power supply voltage (VDD), and the offset voltage term (Vtemp) is proportional to temperature and is a function of process variation. The system further comprises a plurality of devices of the stacked high-voltage signal amplifier to bias with the control voltage biases.

In at least one embodiment, the system is implemented within an integrated circuit (IC) chip.

In one or more embodiments, a system for biasing a stacked high-voltage signal amplifier with a voltage divider bias module comprises the voltage divider bias module to generate, from a power supply voltage (VDD), a plurality of control voltage biases, which comprise a plurality of voltage references plus an offset voltage term (Vtemp). In one or more embodiments, the plurality of voltage references are each proportional to a division of the power supply voltage (VDD), and the offset voltage term (Vtemp) is proportional to temperature and is a function of process variation. The system further comprises a voltage buffer module to receive the control voltage biases, to generate a low impedance output from a high impedance input, and to output the control voltage biases. Further, the system comprises a plurality of devices of the stacked high-voltage signal amplifier to bias with the control voltage biases.

In at least one embodiment, a system for generating equal division of a voltage with a voltage divider module comprises the voltage divider module to generate, from the voltage, a plurality of divider voltages, which comprise a plurality of voltage references plus an offset voltage term (Vtemp). In one or more embodiments, the plurality of voltage references are each proportional to a division of the voltage, and the offset voltage term (Vtemp) is proportional to temperature and is a function of process variation.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

Figure 14:
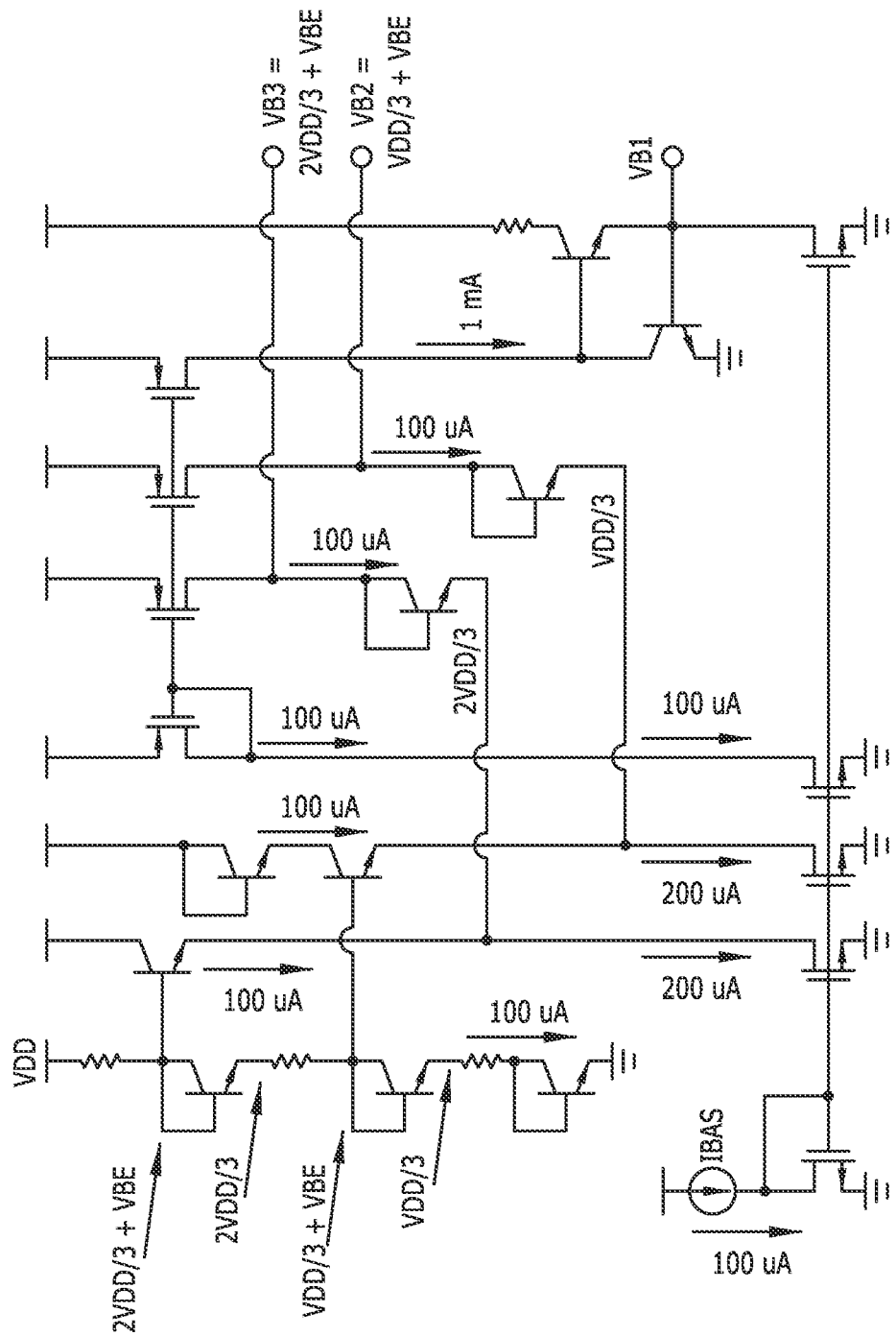
Figure 15:
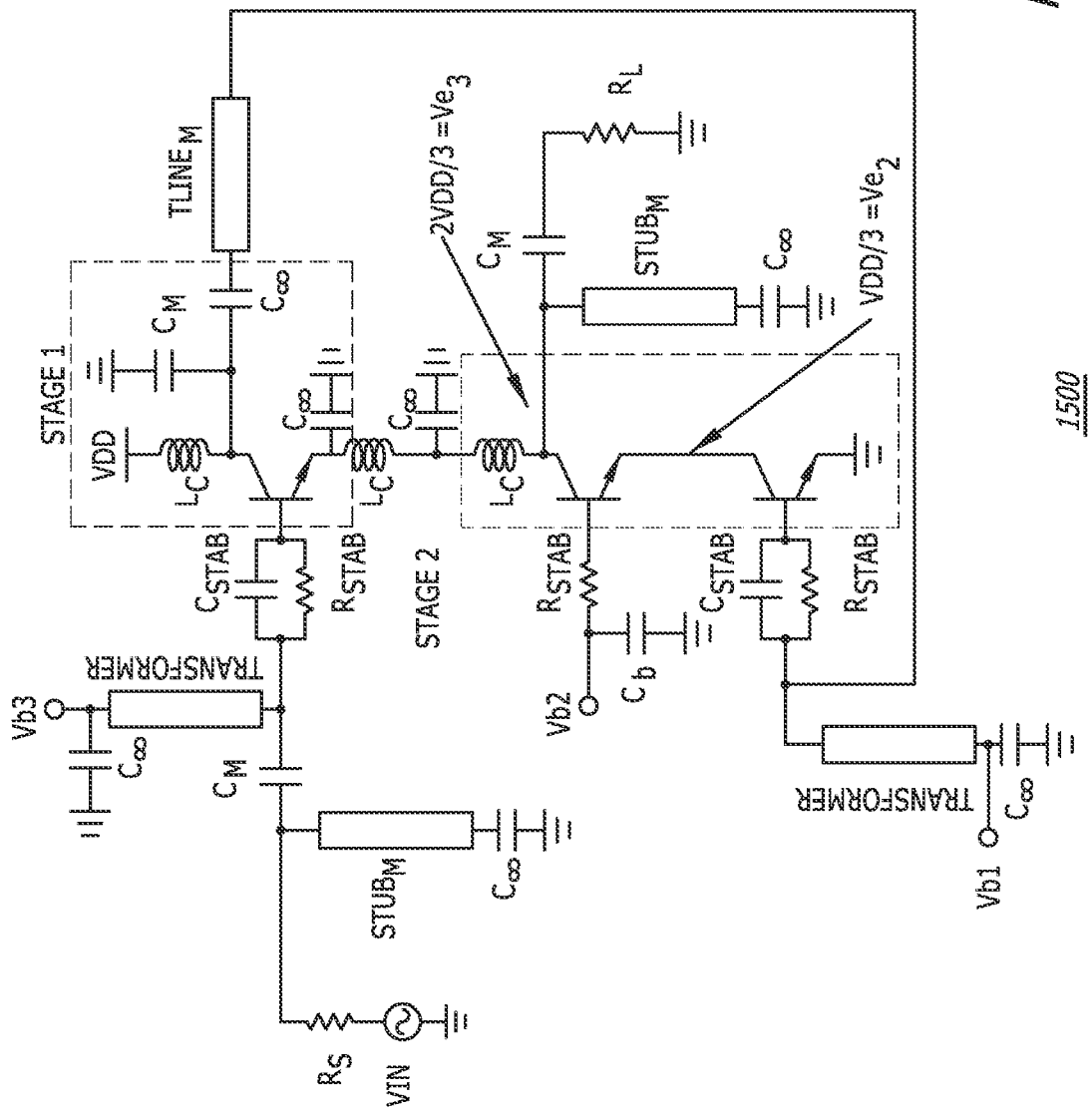

FIGS. 14 and 15 together show an exemplary circuit diagram for the disclosed system for biasing a stacked high-voltage signal amplifier with a bias circuit, in accordance with at least one embodiment of the present disclosure.

FIG. 14 is an exemplary circuit diagram for a bias circuit for the disclosed system for biasing a stacked high-voltage signal amplifier with a voltage divider bias module, in accordance with at least one embodiment of the present disclosure.

FIG. 15 is an exemplary circuit diagram for a stacked high-voltage signal amplifier comprising two stages that may be biased by the bias circuit of FIG. 14, in accordance with at least one embodiment of the present disclosure.

FIGS. 16-22 show simulation and measured results of the exemplary circuit diagram of the disclosed system for biasing a stacked high-voltage signal amplifier with a voltage divider bias module of FIGS. 14 and 15.

Figure 16:
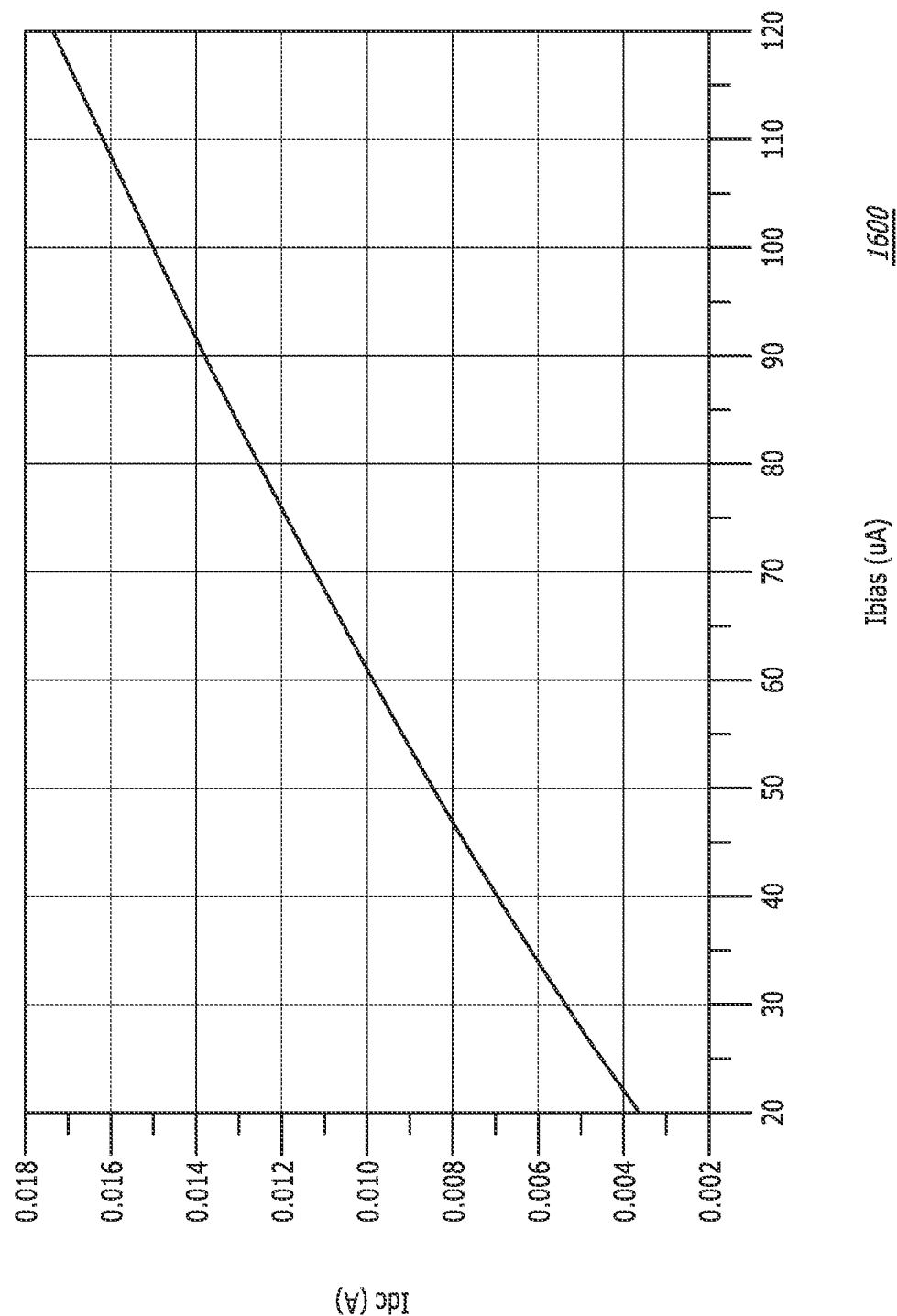

FIG. 16 is a graph showing simulated results of how the DC current (Idc) of the stacked high-voltage signal amplifier of FIG. 15 varies as the bias current (Ibias) is varied.

Figure 17:
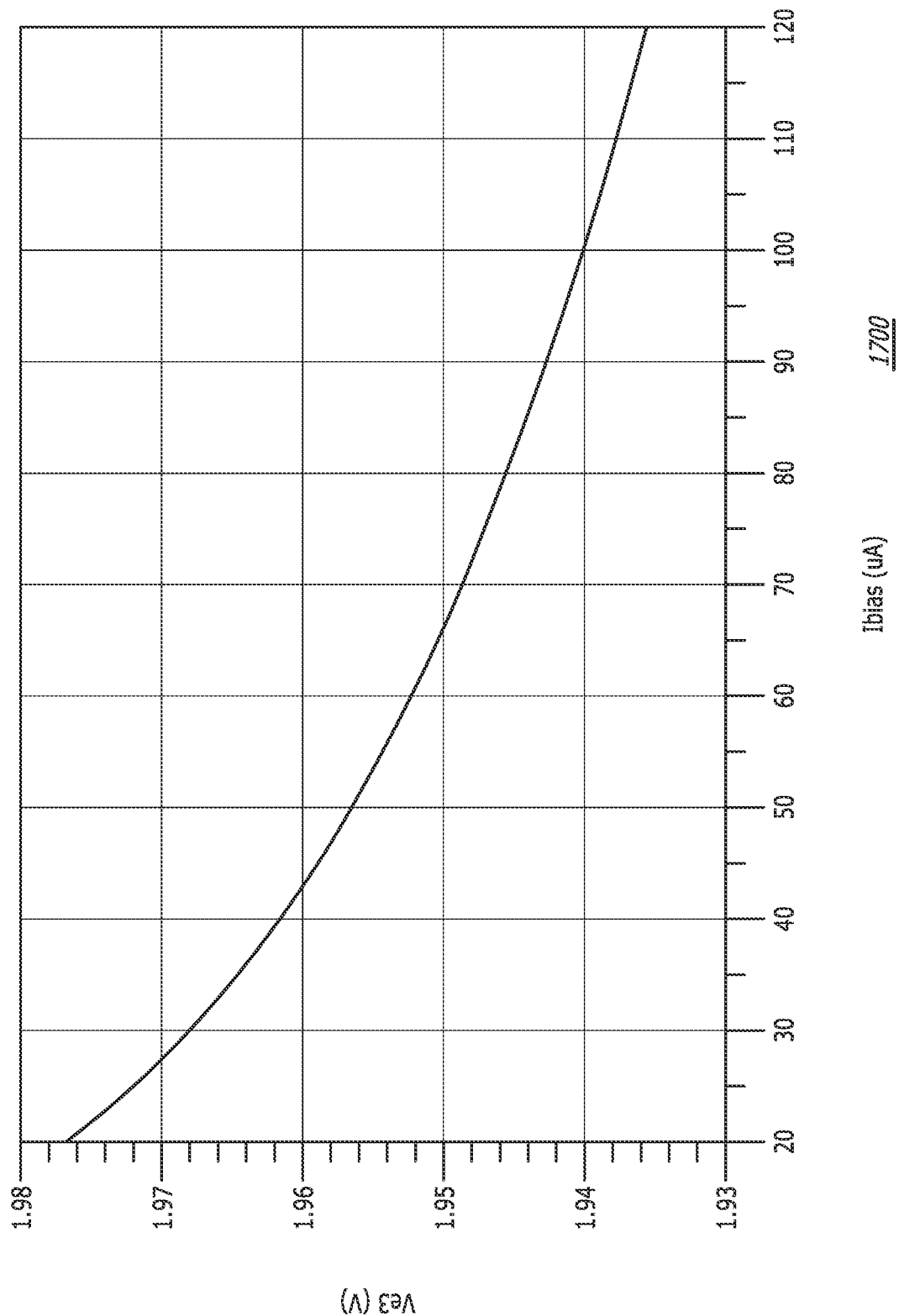

FIG. 17 is a graph showing simulated results of how the voltage $Ve_3$ of the stacked high-voltage signal amplifier of FIG. 15 varies as the bias current (Ibias) is varied.

Figure 18:
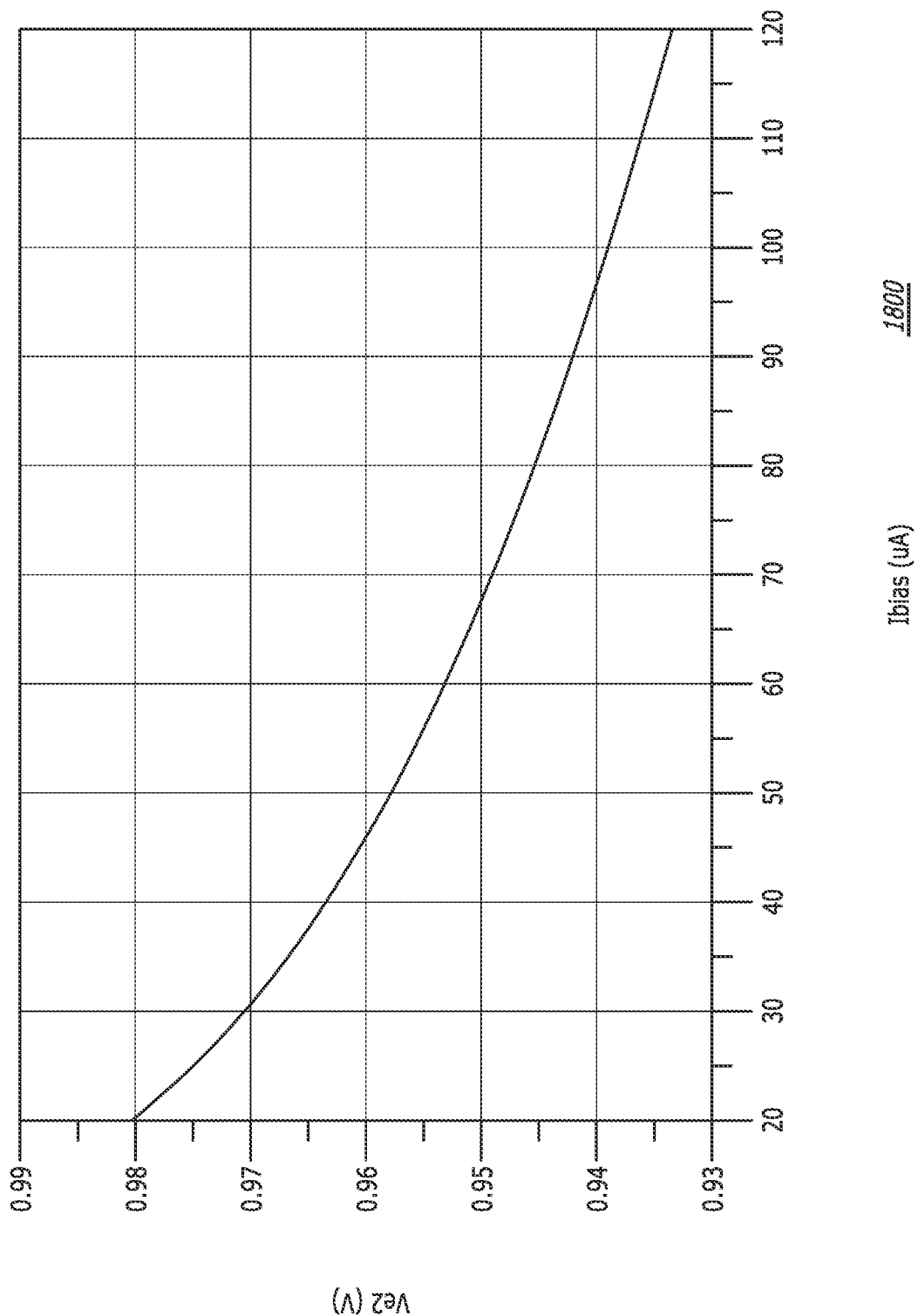

FIG. 18 is a graph showing simulated results of how the voltage $Ve_2$ of the stacked high-voltage signal amplifier of FIG. 15 varies as the bias current (Ibias) is varied.

Figure 2:
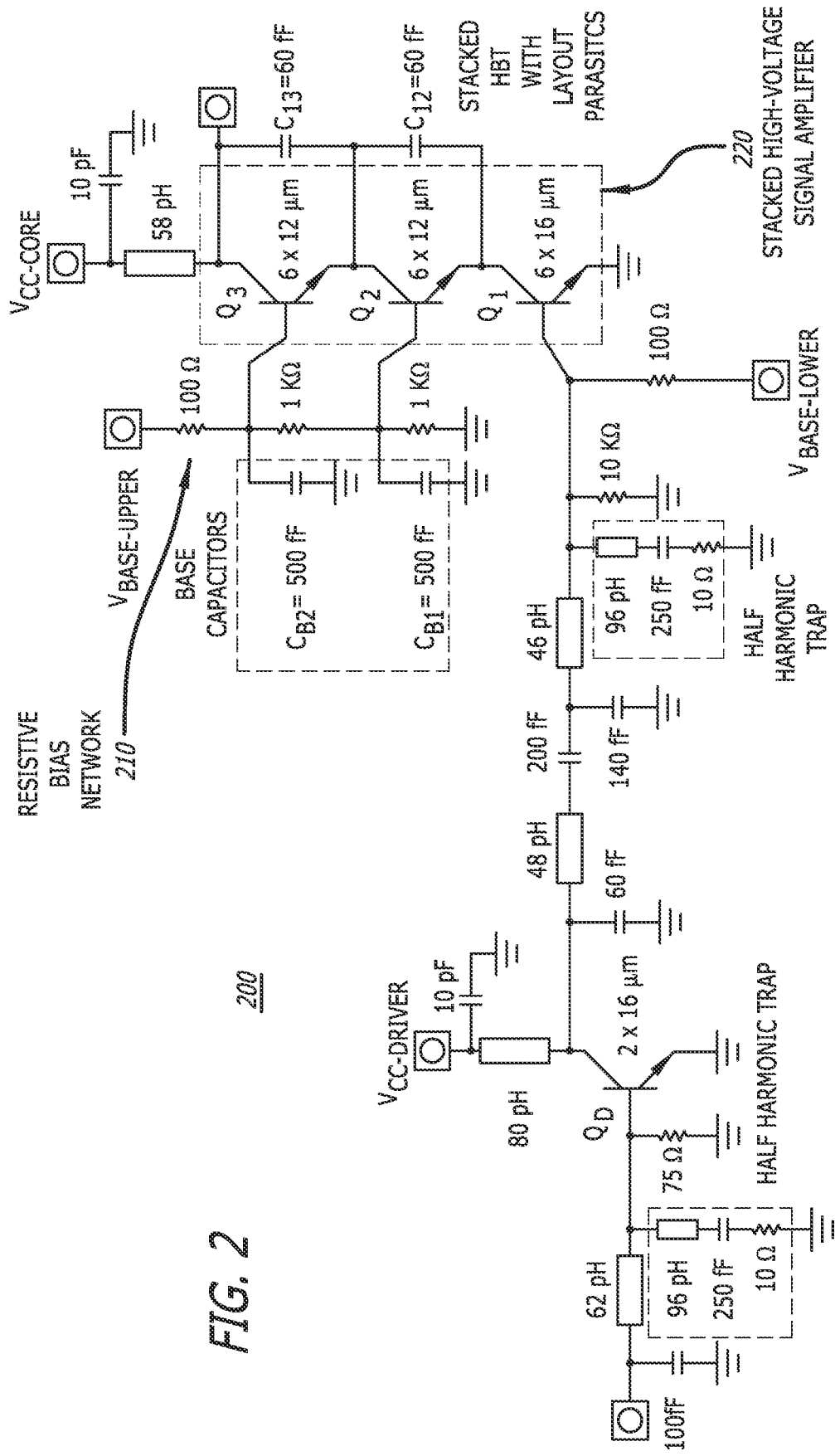
FIG. 2 is a schematic circuit diagram of another conventional two-stage amplifier.
Figure 19:
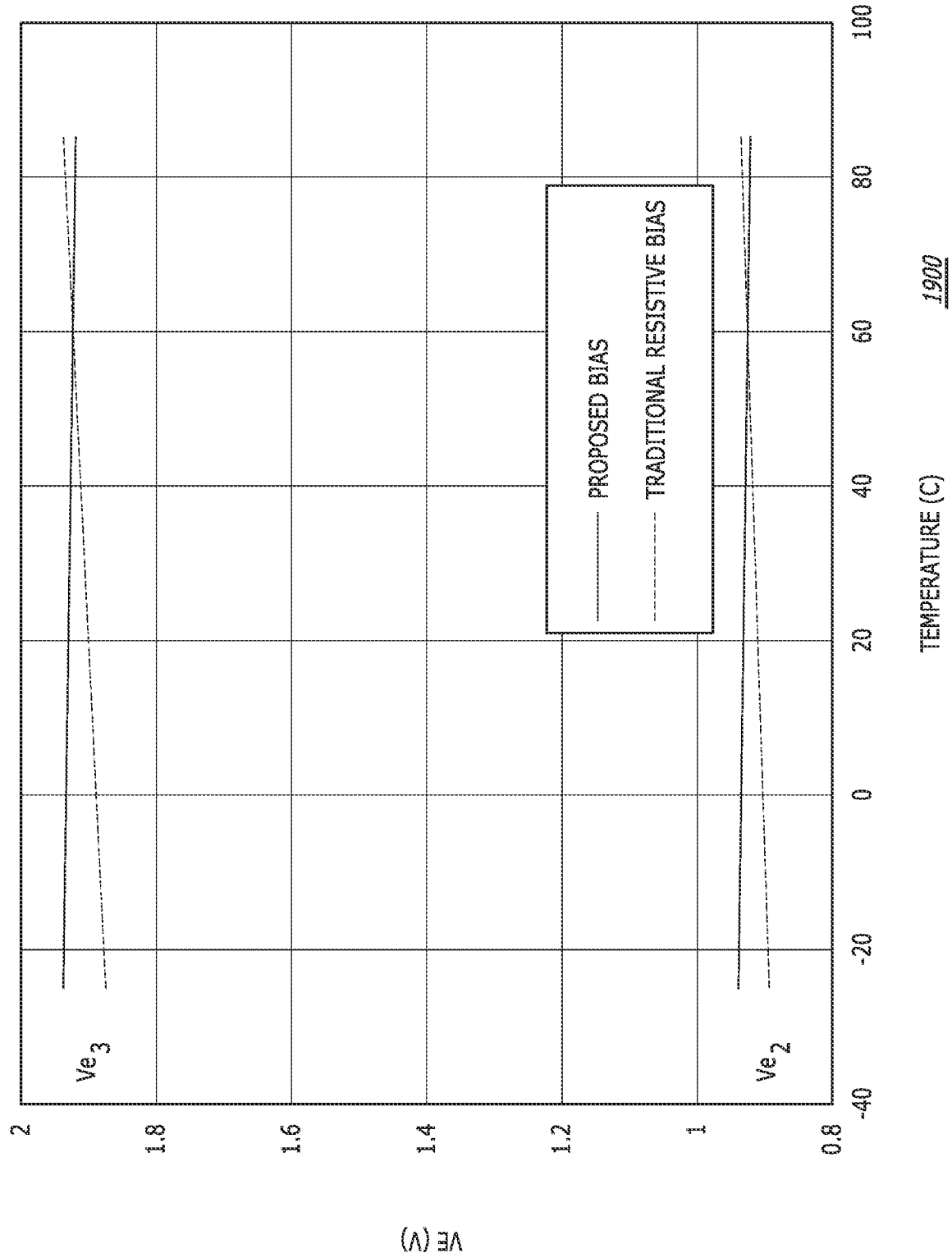

FIG. 19 is a graph showing a simulation of the comparison of temperature performance between the bias circuit of FIG. 14 and the conventional bias circuit as shown in FIG. 2.

Figure 1A:
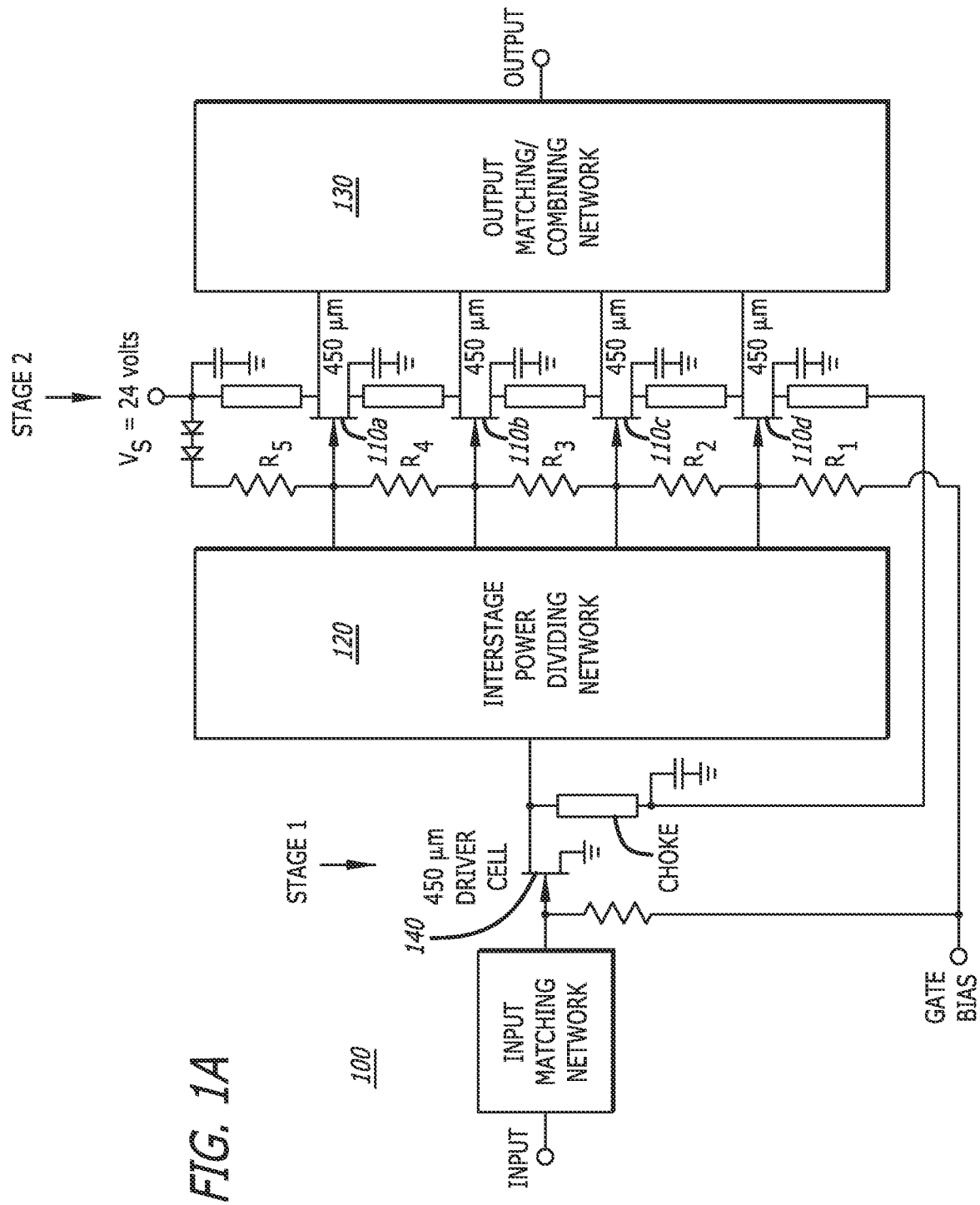
FIG. 1A is a schematic circuit diagram of a conventional two-stage amplifier.
Figure 1B:
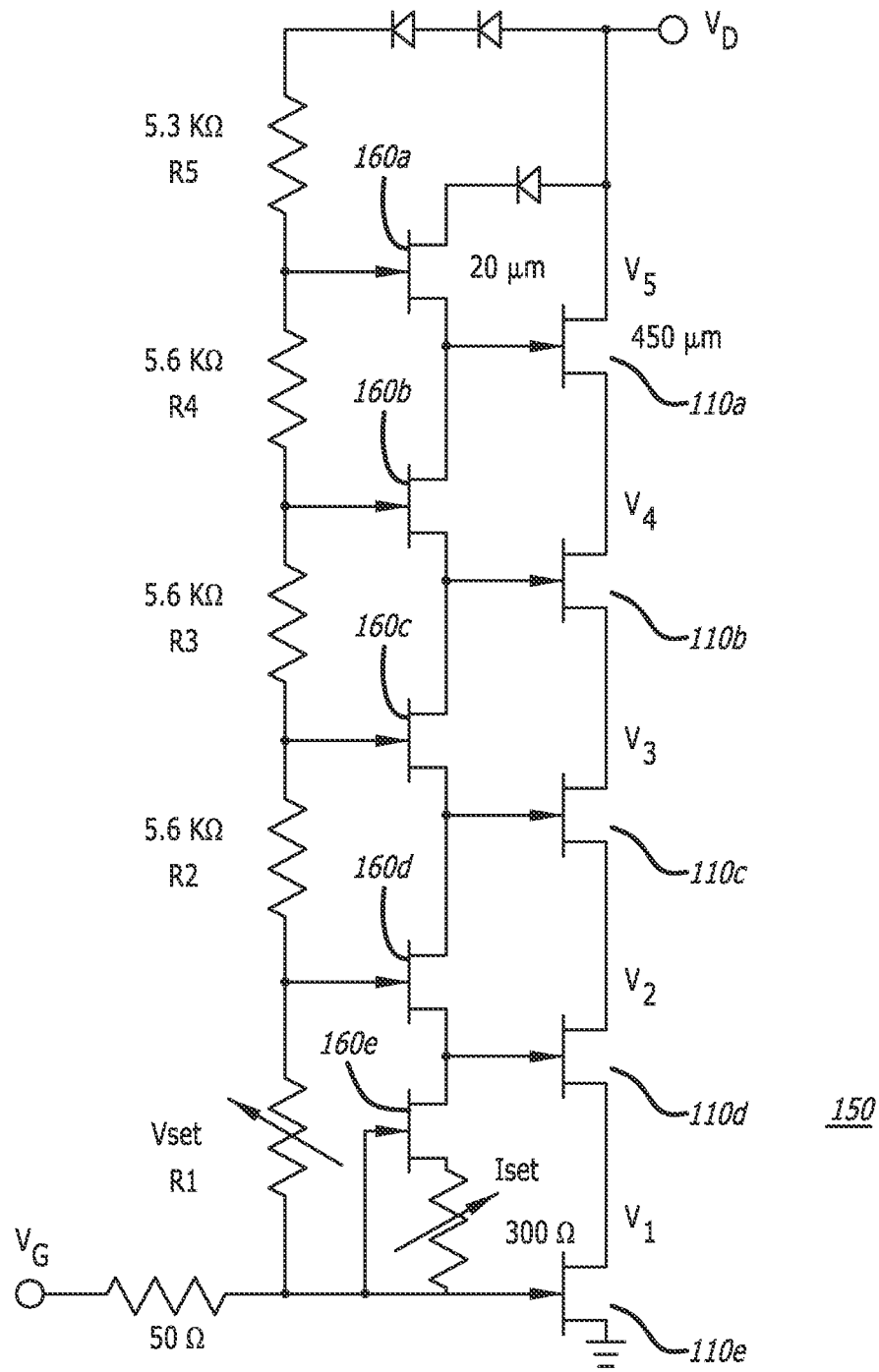
FIG. 1B is a schematic circuit diagram of an active bias network that is implemented into the conventional two-stage amplifier of FIG. 1A.

FIG. 19 is a graph showing a simulation comparison between biasing a stacked high-voltage signal amplifier (e.g., refer to FIG. 15) with the proposed bias circuit of FIG. 14 and with a conventional biasing scheme (e.g., the traditional resistive divider biasing as shown in FIG. 1A, 1B, or 2).

Figure 20:
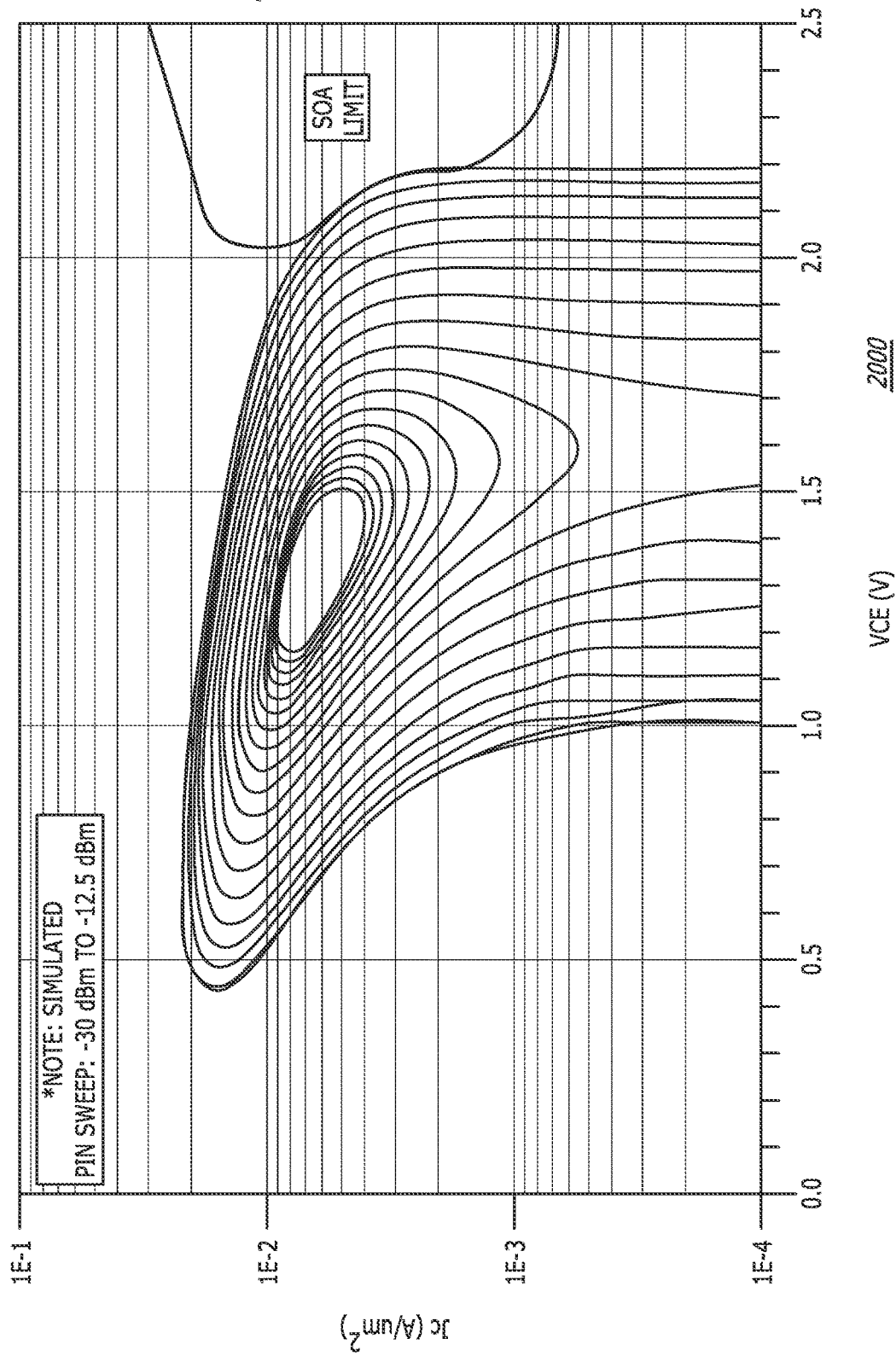

FIG. 20 is a graph showing the simulated output current density (Jc) of the stacked high-voltage signal amplifier of FIG. 15 as the Vce power is varied.

Figure 21:
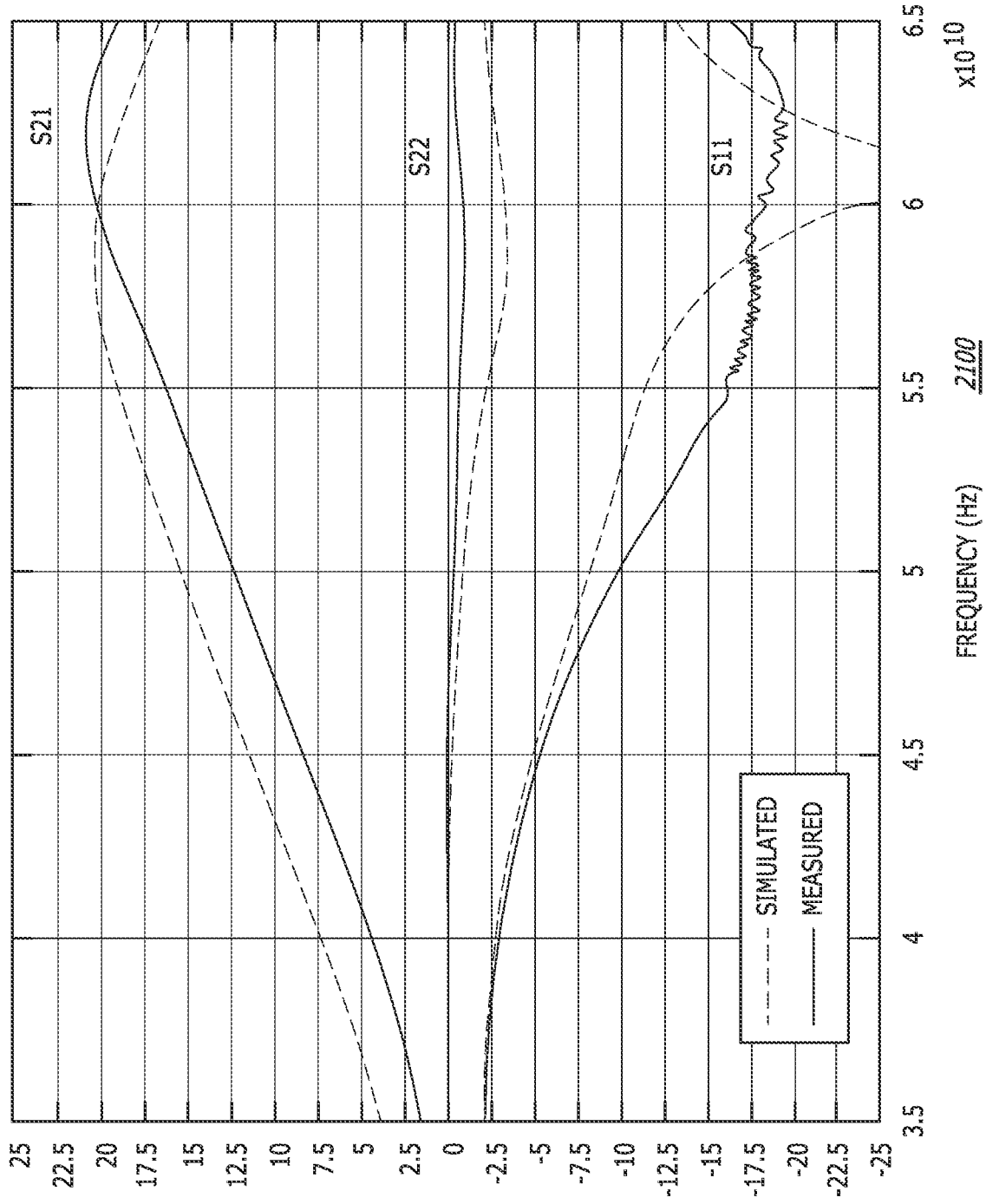

FIG. 21 is a graph showing the simulated and measured S-parameters as the frequency is varied for the stacked high-voltage signal amplifier of FIG. 15.

Figure 22:
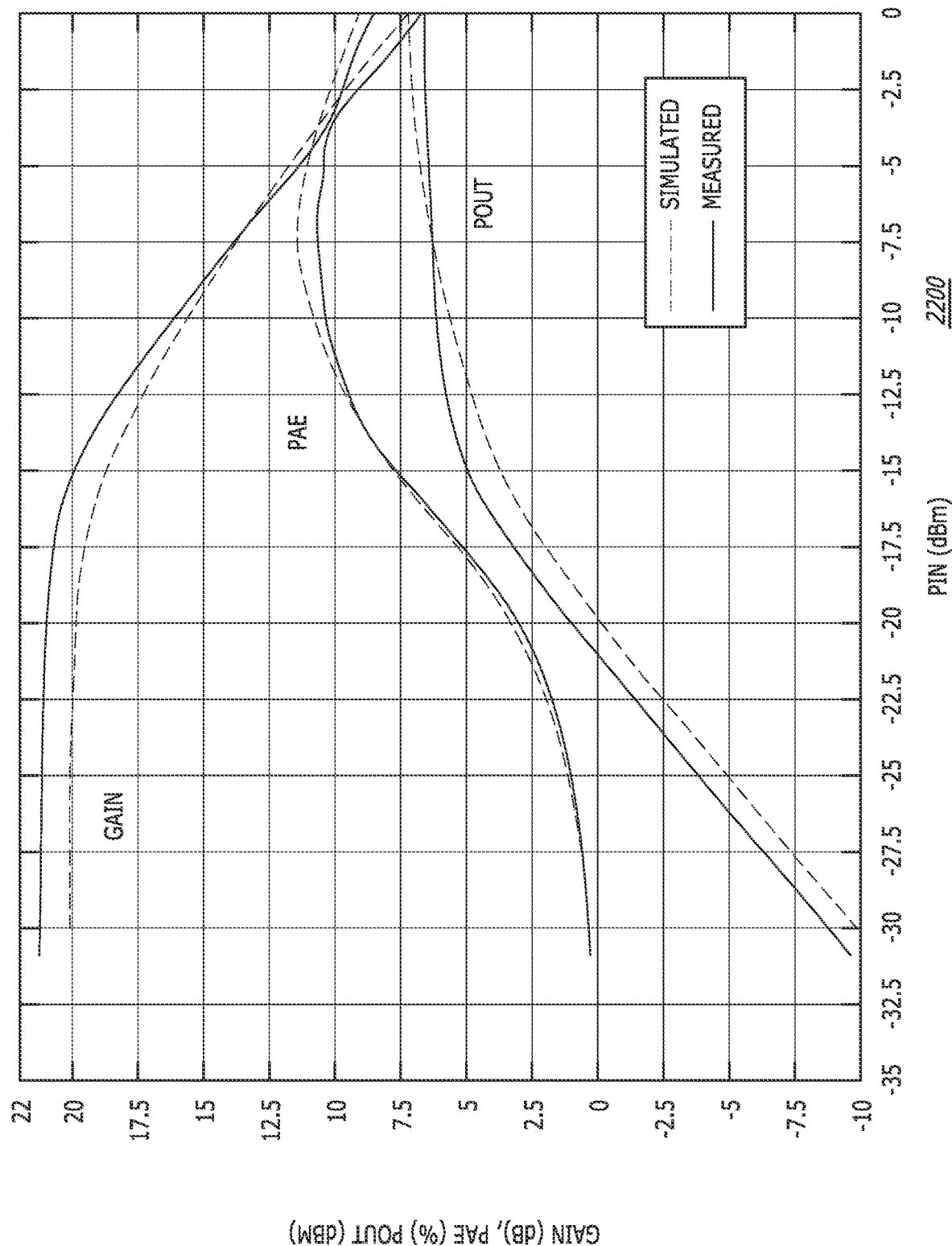

FIG. 22 is a graph showing the simulated and measured gain, power added efficiency (PAE), and output power (Pout) as the input power (Pin) is varied for the stacked high-voltage signal amplifier of FIG. 15.

DESCRIPTION

The methods and apparatuses disclosed herein provide operative systems for an open loop process and temperature independent bias circuit for stacked device amplifiers. In one or more embodiments, the system of the present disclosure provides a temperature independent bias circuit that creates biasing references for a stacked device amplifier intended for high supply voltage systems. In particular, the approach utilizes a resistive divider that creates a voltage reference, which is then mirrored in a manner that is intrinsically temperature compensated and biases the stacked device amplifier in a manner that divides the power supply evenly across each stacked device. The evenly divided power supply voltage across the amplifier devices stays constant, while the DC bias current (Ibias) of the amplifier may be adjusted. The disclosed bias circuit does not utilize any feedback, and is therefore inherently stable.

As previously mentioned above, currently, there are various approaches to biasing stacked device amplifiers, which are known both academically and commercially. "Open loop" bias circuit designs (e.g., refer to the conventional amplifiers 100, 200 of FIGS. 1A and 2) and "closed loop" bias circuit designs have both been employed. Simple resistive divider biasing networks, while being "open loop" with no feedback and inherently stable, do not exhibit performance independent of temperature variation. "Closed loop" bias circuits with feedback, while may provide the regulation of the voltage supply across each stacked device of the amplifier as well as temperature stability, have bias networks that can be potentially unstable. In addition, "closed loop" feedback often limits the current of the amplifier at a fixed bias, thereby limiting the output power and efficiency.

The system of the present disclosure provides a bias circuit intended for amplifiers that employ stacked transistor devices for high voltage supply systems. The disclosed bias circuit provides a reference that biases the stacked device amplifier in such a way that the high voltage supply is divided evenly across the output of each individual transistor device of the amplifier, thereby ensuring device reliability. Moreover, the disclosed bias circuit is independent of temperature variation, thereby ensuring constant performance. Lastly, the disclosed bias circuit is "open loop", meaning no feedback is employed with corresponding stability concerns.

The system of the present disclosure provides a unique approach of creating a voltage divider reference and device current mirror configuration that mirrors the voltage divider reference in a manner such that the amplifier is biased so that the voltage supply is evenly divided across the amplifier stacked devices. The novel approach to mirroring the bias reference ensures the temperature dependent device offset voltage term (Vtemp) (e.g., a base-to-emitter voltage (Vbe) or gate-to-source voltage (Vgs)) is cancelled. The open loop nature of the bias circuit allows the amplifier to draw as much current as needed during an increase in output power, thereby improving output power and efficiency.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to bias circuits, and other functional aspects of the overall system may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

FIG. 1A is a schematic circuit diagram of a conventional two-stage amplifier 100. For this design, a first stage single-device driver amplifier (stage 1), which comprises a driver cell (e.g., comprising a Gallium-Arsenide (GaAs) pseudomorphic high electron mobility transistor (PHEMT) 140), drives a second stage amplifier (stage 2), which employs stacked devices (e.g., GaAs PHEMTs) 110a, 110b, 110c, 110d. In particular, the second stage amplifier (stage 2) employs the stacked devices 110a, 110b, 110c, 110d with parallel-input and parallel-output power combining networks (e.g., an interstage power dividing network 120 and an output matching/combining network 130).

The second stage amplifier (stage 2) utilizes a current-shared stacked-device architecture, in which a high voltage supply (Vs) is divided across each device 110a, 110b, 110c, 110d. The power supply voltage (Vs) (e.g., 24 volts) is divided across the drain-to-source of each device 110a, 110b, 110c, 110d to alleviate voltage breakdown of the device 110a, 110b, 110c, 110d. The second stage amplifier (stage 2) shares a common DC current through the stacked devices 110a, 110b, 110c, 110d (i.e. referred to as "current sharing"). The radio frequency (RF) power combining networks (i.e. interstage power dividing network 120 and output matching/combining network 130) create the input and output RF signal of the second stage amplifier (stage 2).

The DC gate bias of the second stage amplifier (stage 2) is set by a series resistive divider (e.g., achieved via a resistive divider network comprising $R_1$, $R_2$, $R_3$, $R_4$, and $R_5$ resistors) of the supply voltage (VS). The value of the resistors $R_1$, $R_2$, $R_3$, $R_4$, and $R_5$ in the resistive divider network can be designed such that the generated gate biases create an even division of the power supply voltage (VS) across the devices 110a, 110b, 110c, 110d, thereby insuring reliability of the devices 110a, 110b, 110c, 110d from the high power supply voltage (VS).

The voltage division stability of the resistive divider network (e.g., comprising $R_1$, $R_2$, $R_3$, $R_4$, and $R_5$ resistors) can be improved by implementing an active bias network (refer to 150 of FIG. 1B), which comprises an inner stage buffer driver implemented with a stacked source follower module, into the amplifier 100 of FIG. 1A. FIG. 1B is a schematic circuit diagram of the active bias network 150 that is implemented into the conventional two-stage amplifier 100 of FIG. 1A. In particular, the active bias network 150 incorporates a second string of series cells (e.g., comprising devices 160a, 160b, 160c, 160d, 160e) to act as a buffer between the resistive divider network (e.g., comprising $R_1$, $R_2$, $R_3$, $R_4$, and $R_5$ resistors) and the RF cell array (e.g., comprising devices 110a, 110b, 110c, 110d, 110e). The inclusion of the active bias network 150 into the amplifier 100 improves the stability of the voltage divider network by a factor of 10 or more. However, a major disadvantage of the designs of FIGS. 1A and 1B (i.e. either the stand-alone resistive divider network design of FIG. 1A, or a design that implements the active bias network 150 of FIG. 1B with the resistive divider network of FIG. 1A) is that the gate bias of the amplifier 100 will be temperature dependent and, therefore, the biases and performance of the amplifier 100 will vary versus temperature (i.e. the biases and performance of the amplifier 100 will not be temperature independent).

FIG. 2 is a schematic circuit diagram of another conventional two-stage amplifier 200. For this design, a first stage single-device driver amplifier, which comprises a driver cell (e.g., comprising a Silicon-Germanium (SiGe) bipolar junction transistors (BJT) device $Q_D$), drives a second stage amplifier 220, which employs stacked devices (e.g., SiGe BJTs) $Q_1$, $Q_2$, $Q_3$. Similar to the second stage amplifier (stage 2) of FIG. 1A, the second stage amplifier 220 of FIG. 2 shares a common DC current through the stacked devices $Q_1$, $Q_2$, $Q_3$ (referred to as "current sharing"). However, in contrast to the second stage amplifier (stage 2) of FIG. 1A, RF power combining is not utilized for the second stage amplifier 220 of FIG. 2, but instead "voltage combining" of the RF output signal among the stacked devices $Q_1$, $Q_2$, $Q_3$ is employed.

Similar to the second stage amplifier (stage 2) of FIG. 1A, the second stage amplifier 220 of FIG. 2 utilizes resistive dividing biasing (e.g., via a resistive bias network 210 comprising resistors) for the base DC bias control of each stacked device $Q_1$, $Q_2$, $Q_3$ to create an even division of the power supply voltage across each device collector-to-emitter voltage (Vce). However, as in the designs of FIGS. 1A and 1B (i.e. a stand-alone resistive divider network design of FIG. 1A, or a design that incorporates the active bias network 150 of FIG. 1B along with the resistive divider network of FIG. 1A), the voltage across each device $Q_1$, $Q_2$, $Q_3$ Vce will be a function of temperature. The temperature dependency is due to the fact that the temperature dependent base-to-emitter voltage (Vbe) of the stacked devices $Q_1$, $Q_2$, $Q_3$ is uncompensated and varies proportionally to temperature.

It should be noted that although the conventional amplifier designs shown in FIGS. 1A, 1B, and 2 employ various different RF combining techniques, the designs have the commonality of having devices stacked in DC cascode sharing a common DC current. Since these conventional amplifier designs utilize resistive biasing for the DC bias operating point, they will have the major disadvantage of having their performance dependent upon variation in temperature (i.e. their performance is not temperature independent).

Figure 3:
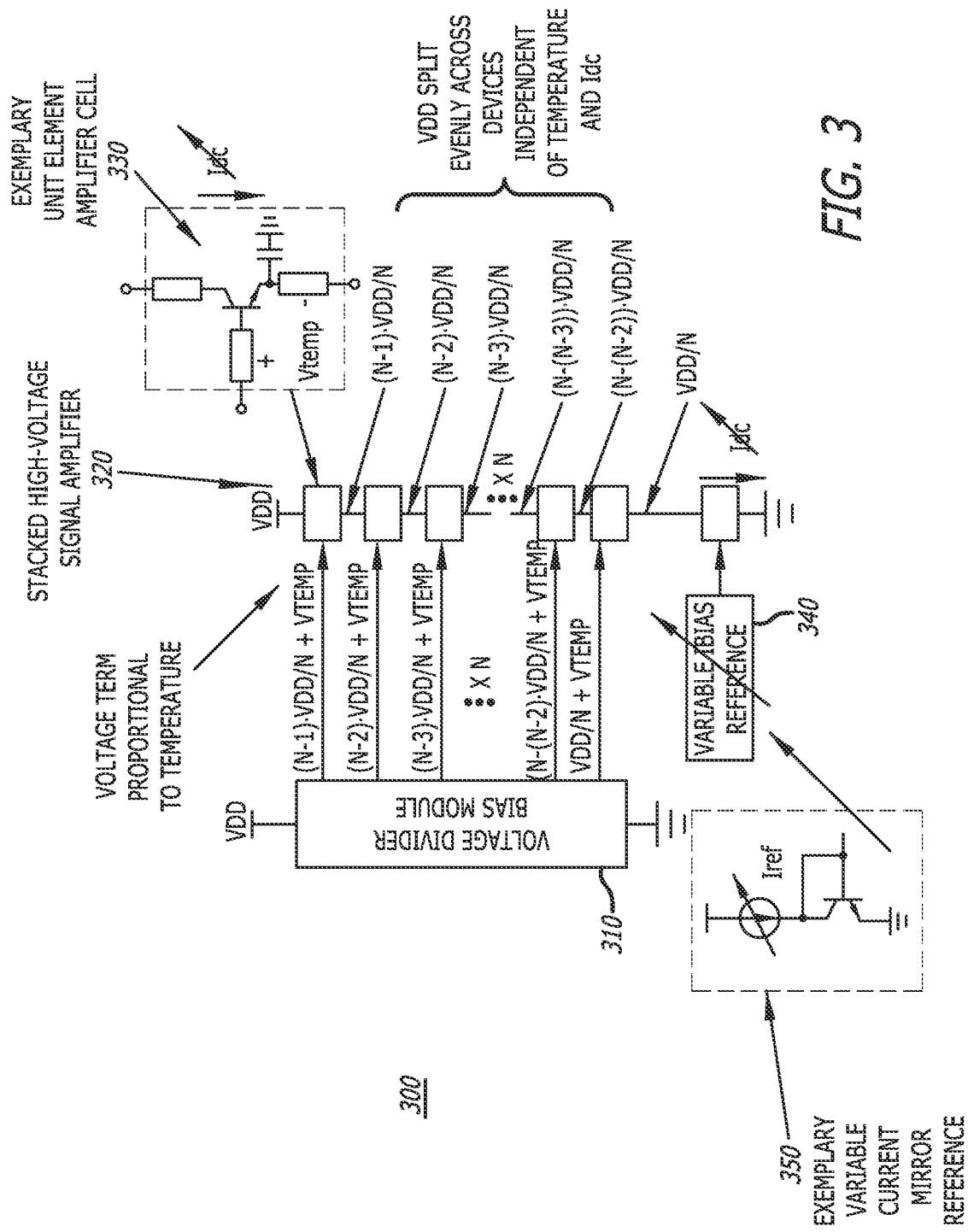
FIG. 3 is a schematic circuit diagram of the disclosed system for biasing a stacked high-voltage signal amplifier with a voltage divider bias module, in accordance with at least one embodiment of the present disclosure.

FIG. 3 is a schematic circuit diagram of the disclosed system 300 for biasing a stacked high-voltage signal amplifier 320 with a voltage divider bias module 310, in accordance with at least one embodiment of the present disclosure. In this figure, the system 300 is shown to comprise the stacked high-voltage signal amplifier 320 and the voltage divider bias module 320.

The stacked high-voltage signal amplifier 320 of FIG. 3 comprises a single stage. However, it should be noted that in other embodiments, the stacked high-voltage signal amplifier 320 of the disclosed system 300 may comprise more than one stage (e.g., refer to the two-stage stacked high-voltage signal amplifier 1500 of FIG. 15).

The stacked high-voltage signal amplifier 320 comprises a plurality of unit element amplifier cells 330 that are stacked together such that they share a common direct current (DC) current (Idc). The unit element amplifier cells 330 are connected together in a cascode configuration. It should be noted that the term "cascode" is defined herein as and used throughout to mean "a plurality of units with a first unit having the following plurality of units connected on top of the first unit in a 'stacked' succession." Each unit element amplifier cell 330 of the voltage divider bias module 320 comprises a device, such as a transistor (e.g., a bipolar junction transistor (BJT) or a complementary metal-oxide semiconductor (CMOS) transistor) or other three-terminal amplifying device.

Figure 9:
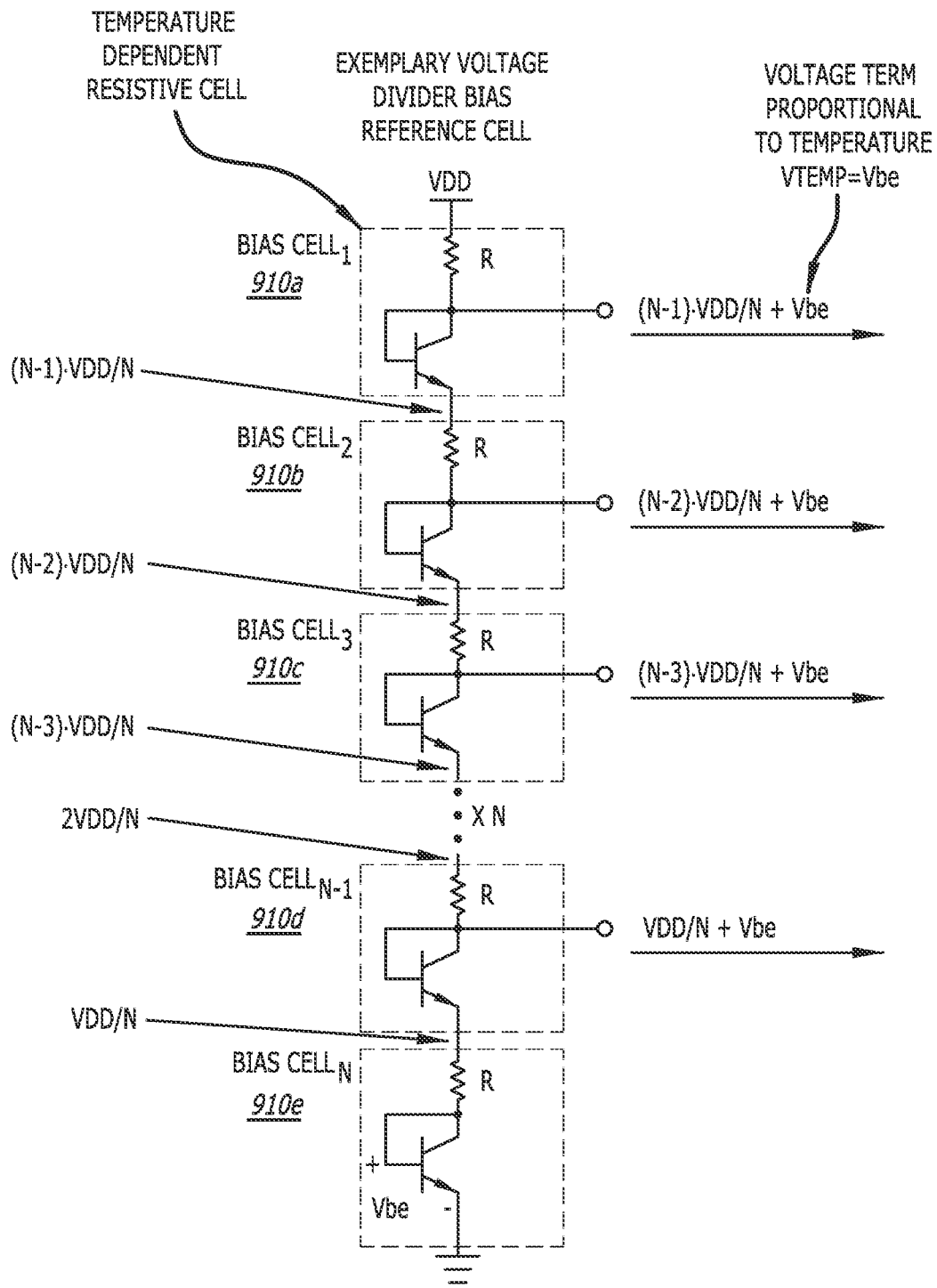
FIG. 9 is detailed exemplary schematic circuit diagram of the voltage bias divider module of FIGS. 5, 6, 8A, and 8B, in accordance with at least one embodiment of the present disclosure.

Referring to FIG. 9, the voltage divider bias module 310 comprises a plurality of temperature-dependent resistive cells (e.g., Bias Cell₁ 910a, Bias Cell₂ 910b, Bias Cell₃ 910c, Bias Cell₄ 910d, Bias Cell₅ 910e) connected together in series and sharing a common direct current (DC). Each temperature-dependent resistive cell 910a, 910b, 910c, 910d, 910e comprises a diode-connected device connected to a resistor R in series. Each diode-connected device is a transistor (e.g., a bipolar junction transistor (BJT) or a complementary metal-oxide semiconductor (CMOS) transistor) or other three-terminal amplifying device.

Referring to FIGS. 3 and 9, it should be noted that, in one or more embodiments, the devices of the temperature-dependent resistive cells 910a, 910b, 910c, 910d, 910e of the voltage bias module 310 have the same temperature coefficient of a threshold voltage as the devices in the unit element amplifier cells 330 of the stacked high-voltage signal amplifier 320. In at least one embodiment, the devices of temperature-dependent resistive cells 910a, 910b, 910c, 910d, 910e of the voltage bias module 310 are of a same type (e.g., BJTs or CMOS transistors) with a same current density as the devices in the unit element amplifier cells 330 of the stacked high-voltage signal amplifier 320.

In addition, it follows that that when the devices of temperature-dependent resistive cells 910a, 910b, 910c, 910d, 910e of the voltage bias module 310 and the devices of in the unit element amplifier cells 330 of the stacked high-voltage signal amplifier 320 are implemented as BJTs, an offset voltage term (Vtemp) (which will be discussed in more detail below) is equal to the base-to-emitter voltage (Vbe) of the devices of the unit element amplifier cells 330 of the stacked high-voltage signal amplifier 320. And, when the devices of temperature-dependent resistive cells 910a, 910b, 910c, 910d, 910e of the voltage bias module 310 and the devices of in the unit element amplifier cells 330 of the stacked high-voltage signal amplifier 320 are implemented as CMOS transistors, the offset voltage term (Vtemp) is equal to the gate-to-source voltage (Vgs) of the devices of the unit element amplifier cells 330 of the stacked high-voltage signal amplifier 320.

Referring to FIGS. 3 and 9, for a stacked high-voltage signal amplifier 320 with "N" total number of stacked devices (or "N" total number of unit element amplifier cells 330), the voltage divider bias module 310 will have "N" total number of temperature-dependent resistive cells 910a, 910b, 910c, 910d, 910e, and have "N−1" total number of voltage control outputs. In one or more embodiments, the system 300 of FIG. 3 is implemented within in integrated circuit (IC) chip.

During operation of the system 300 of FIG. 3, a power supply voltage (VDD) is inputted into the voltage divider bias module 310. Also, a bias current reference (e.g., a variable bias current reference) 340 (e.g., in the form of a variable current mirror reference 350) sets a common DC current (Idc) flowing through the stacked high-voltage signal amplifier 320. The voltage divider bias module 310 takes as an input the power supply voltage (VDD), and subsequently produces a plurality of control voltage biases (e.g., (N−1) VDD/N+Vtemp, (N−2)VDD/N+Vtemp, (N−3)VDD/N+Vtemp, (N−(N−2))VDD/N+Vtemp, VDD/N+Vtemp). Each control voltage bias comprises a voltage reference plus an offset voltage term (Vtemp). Each voltage reference is proportional to a division of the power supply voltage (VDD), and the offset voltage term (Vtemp) is proportional to temperature and is a function of process variation.

The control voltage biases outputted from the voltage divider bias module 310 then respectively bias the gate/base of the devices in the unit element amplifier cells 330 of stacked high-voltage signal amplifier 320 in such a manner that the gate-to-source voltage (Vgs) (or base-to-emitter voltage (Vbe)), as dependent on technology and is proportional to temperature (as is Vtemp), is cancelled. The net effect is that the stacked devices of the unit element amplifier cells 330 of the stacked high-voltage signal amplifier 320 have an evenly divided power supply voltage across each device drain-to-source voltage (Vds) (or collector-to-emitter voltage (Vce)), and the stacked devices' performance is independent of temperature, in contrast to the conventional amplifiers (e.g., refer to the amplifiers 100, 200 of FIGS. 1A and 2).

Lastly, the bias current of the stacked high-voltage signal amplifier 320 may be varied (i.e. vary Idc), and the temperature independence of the devices of the stacked high-voltage signal amplifier 320 is maintained as long as the voltage divider bias module's 310 offset voltage term (Vtemp) is varied proportionally to the offset voltage term (Vtemp) of the stacked high-voltage signal amplifier 320 and cancels out accordingly.

Figure 4:
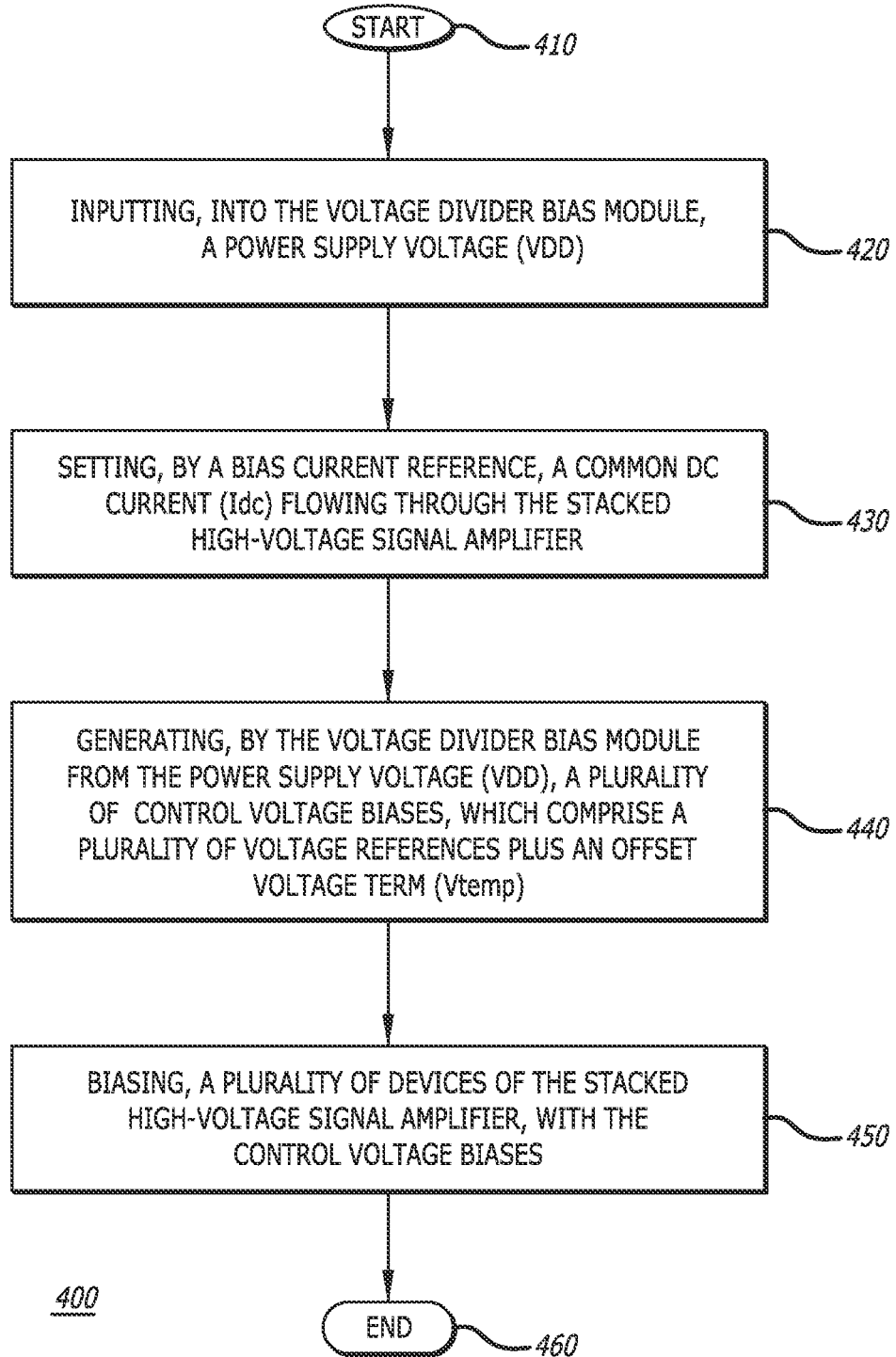
FIG. 4 is a flow chart showing the disclosed method for biasing the stacked high-voltage signal amplifier with the voltage divider bias module of FIG. 3, in accordance with at least one embodiment of the present disclosure.

FIG. 4 is a flow chart showing the disclosed method 400 for biasing the stacked high-voltage signal amplifier (refer to 320 of FIG. 3) with the voltage divider bias module (refer to 310 of FIG. 3) of FIG. 3, in accordance with at least one embodiment of the present disclosure. At the start 410 of the method 400, a power supply voltage (VDD) is inputted into the voltage divider bias module 420. A common DC current (Idc) flowing through the stacked high-voltage signal amplifier is also set 430. Then, the voltage divider bias module generates, from the power supply voltage (VDD), a plurality of control voltage biases, which comprise a plurality of voltage references plus an offset voltage term (Vtemp) 440. In one or more embodiments, the plurality of voltage references are each proportional to a division of the power supply voltage (VDD), and the offset voltage term (Vtemp) is proportional to temperature and is a function of process variation. Then, a plurality of devices of the stacked high-voltage signal amplifier is biased with the control voltage biases 450. Then, the method 400 ends 460.

Figure 5:
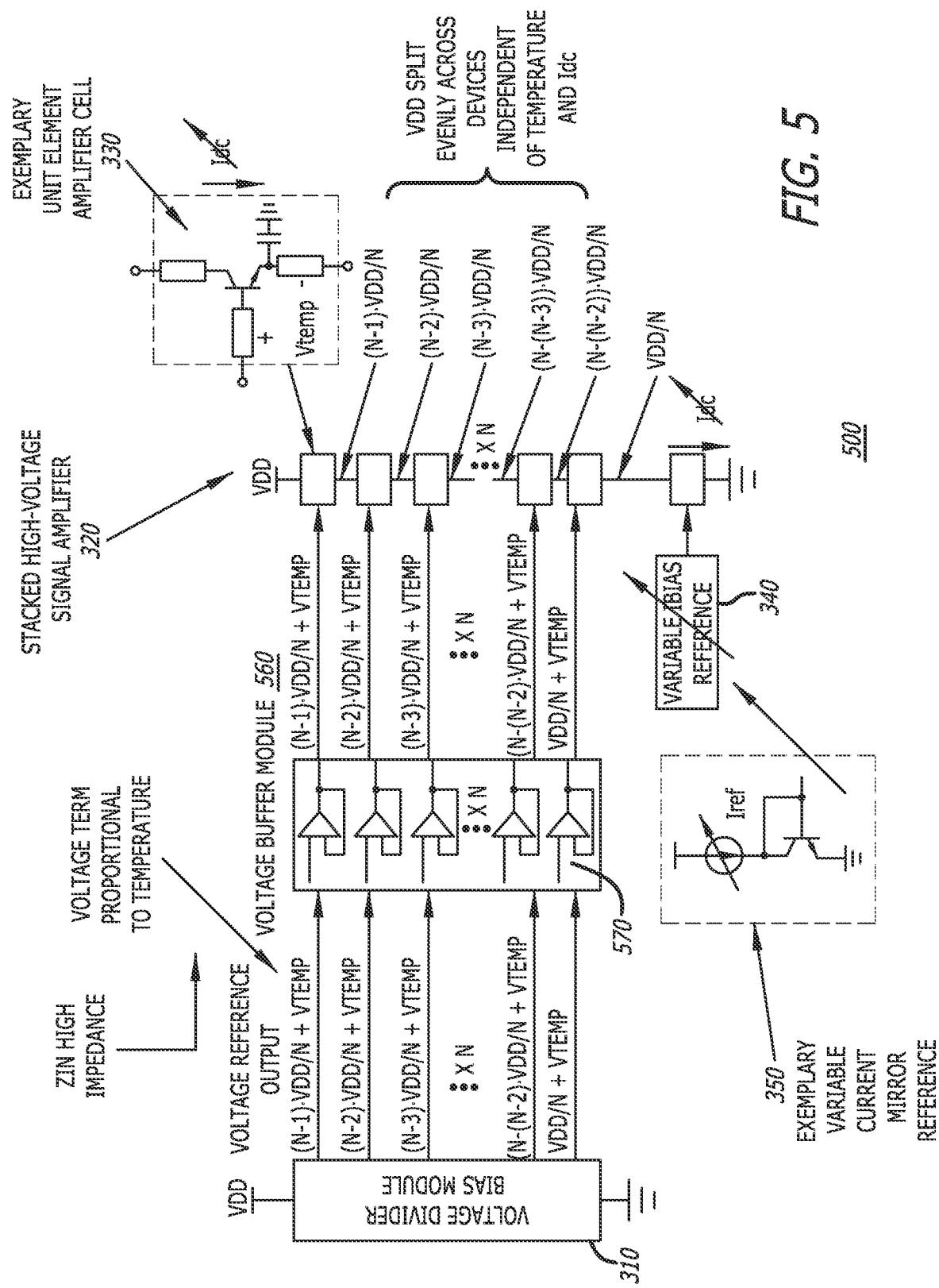
FIG. 5 is a schematic circuit diagram of the disclosed system for biasing a stacked high-voltage signal amplifier with a voltage divider bias module and a voltage buffer module, which employs unity-gain buffers, in accordance with at least one embodiment of the present disclosure.

FIG. 5 is a schematic circuit diagram of the disclosed system 500 for biasing a stacked high-voltage signal amplifier 320 with a voltage divider bias module 310 and a voltage buffer module 560, which employs unity-gain buffers 570, in accordance with at least one embodiment of the present disclosure. The system 500 of FIG. 5 is similar to the system 300 of FIG. 3, except that the system 500 of FIG. 5 comprises an additional inner stage voltage buffer module 560 that follows the voltage divider bias module 310. The functional operation of the voltage buffer module 560 is to provide a high input impedance, low output impedance interface between the voltage divider bias module 310 and the stacked high-voltage signal amplifier's 320 device gate/base control. The intention of the addition of the voltage buffer module 560 is to mirror the outputs of the voltage divider bias module 310, and to isolate the stacked high-voltage signal amplifier 320 from the voltage divider bias module 310 such that the output of the voltage divider bias module 310 is independent of the stacked high-voltage signal amplifier 320.

In one or more embodiments, the voltage buffer module 560 comprises a plurality of unity-gain buffers. In at least one embodiment, operational amplifiers (op-amps) 570 may be employed for the unity-gain buffers. In one or more embodiments, the op-amps 570 are configured in the voltage buffer module 560 in a voltage follower configuration. If the design of the unity-gain buffers is correctly designed to be temperature independent, then the same temperature independence of the stacked high-voltage signal amplifier's 320 output voltage across the devices is maintained, similar to the system 300 of FIG. 3. In one or more embodiments, the system 500 of FIG. 5 is implemented within in integrated circuit (IC) chip.

During operation of the system 500 of FIG. 5, a power supply voltage (VDD) is inputted into the voltage divider bias module 310. In addition, a bias current reference (e.g., a variable bias current reference) 340 (e.g., in the form of a variable current mirror reference 350) sets a common DC current (Idc) flowing through the stacked high-voltage signal amplifier 320. The voltage divider bias module 310 takes as an input the power supply voltage (VDD), and subsequently produces a plurality of control voltage biases (e.g., (N−1) VDD/N+Vtemp, (N−2)VDD/N+Vtemp, (N−3)VDD/N+Vtemp, (N−(N−2)VDD/N+Vtemp, VDD/N+Vtemp). Each control voltage bias comprises a voltage reference plus an offset voltage term (Vtemp). Each voltage reference is proportional to a division of the power supply voltage (VDD), and the offset voltage term (Vtemp) is proportional to temperature and is a function of process variation.

Then, the unity-gain buffers of the voltage buffer module 560 receive the plurality of control voltage biases. The unity-gain buffers of the voltage buffer module 560 generate a low impedance output from a high impedance input. Then, the unity-gain buffers of the voltage buffer module 560 output the plurality of control voltage biases.

The control voltage biases outputted from the voltage buffer module 560 then respectively bias the gate/base of the devices in the unit element amplifier cells 330 of stacked high-voltage signal amplifier 320 in such a manner that the gate-to-source voltage (Vgs) (or base-to-emitter voltage (Vbe)), as dependent on technology and is proportional to temperature (as is Vtemp), is cancelled. The net effect is that the stacked devices of the unit element amplifier cells 330 of the stacked high-voltage signal amplifier 320 have an evenly divided power supply voltage across each device drain-to-source voltage (Vds) (or collector-to-emitter voltage (Vce)), and the stacked devices' performance is independent of temperature.

Figure 6:
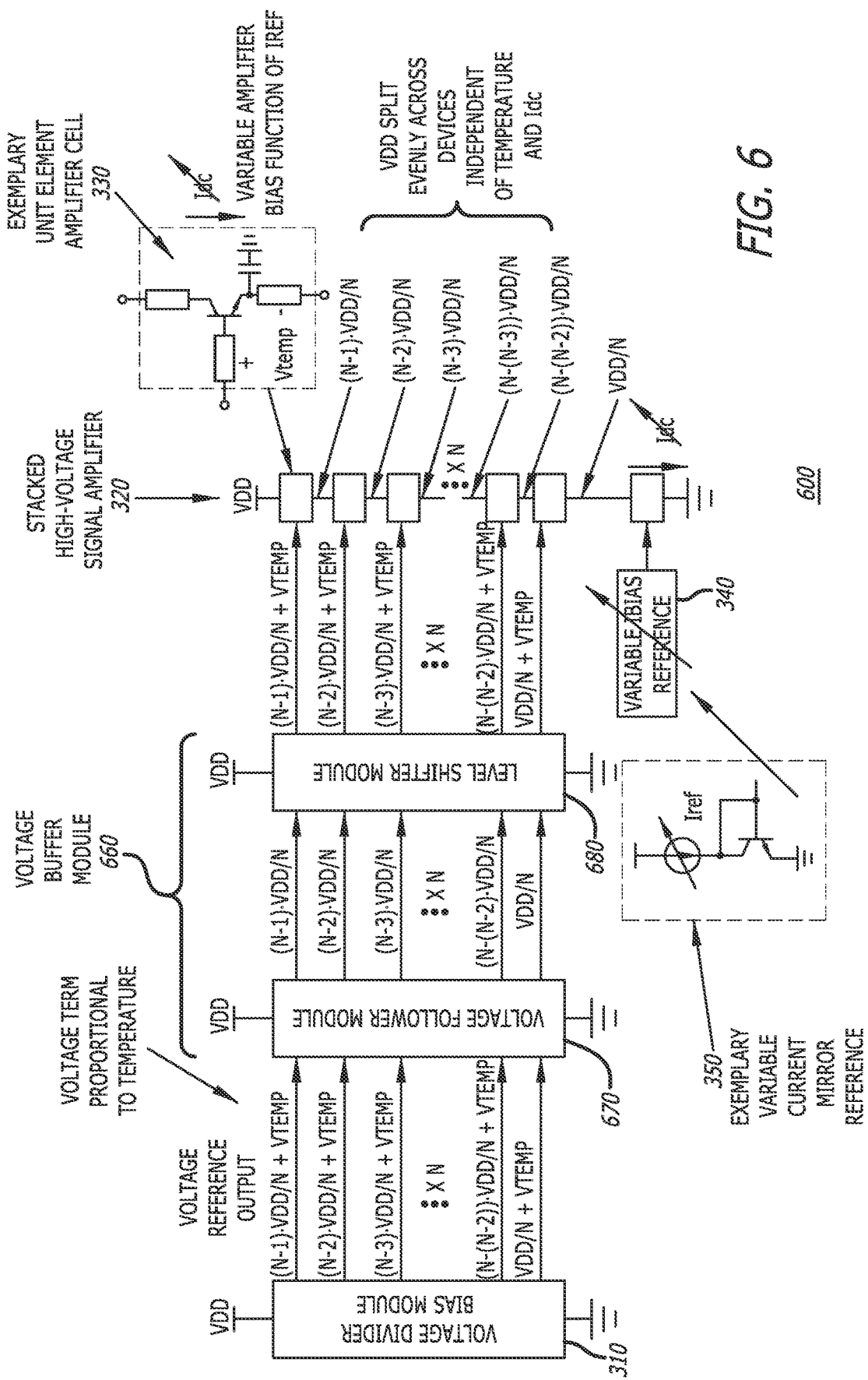
FIG. 6 is a schematic circuit diagram of the disclosed system for biasing a stacked high-voltage signal amplifier with a voltage divider bias module and a voltage buffer module, which employs a voltage follower module and a level shifter module, in accordance with at least one embodiment of the present disclosure.

FIG. 6 is a schematic circuit diagram of the disclosed system 600 for biasing a stacked high-voltage signal amplifier 320 with a voltage divider bias module 310 and a voltage buffer module 660, which employs a voltage follower module 670 and a level shifter module 680 in accordance with at least one embodiment of the present disclosure. The system 600 of FIG. 6 is similar to the system 500 of FIG. 5, except that the voltage buffer module 660 of the system 600 of FIG. 6 comprises a voltage follower module 670 cascaded with a level shifter module 680, instead of comprising a plurality of unity-gain buffers as in the system 500 of FIG. 5.

Similar to the functional operation of the voltage buffer module 560 of the system 500 of FIG. 5, the functional operation of the voltage buffer module 660 of the system 600 of FIG. 6 is to provide a high input impedance, low output impedance interface between the voltage divider bias module 310 and the stacked high-voltage signal amplifier's 320 device gate/base control. The purpose of the addition of the voltage buffer module 560 is to mirror the outputs of the voltage divider bias module 310, and to isolate the stacked high-voltage signal amplifier 320 from the voltage divider bias module 310 such that the output of the voltage divider bias module 310 is independent of the stacked high-voltage signal amplifier 320. In one or more embodiments, the voltage follower module 670 and the level shifter module 680 comprise devices that are scaled such that an additional offset voltage term (Vtemp) generated by the voltage follower module 670 is canceled out by the level shifter module 680.

During operation of the system 600 of FIG. 6, the power supply voltage (VDD) is inputted into the voltage divider bias module 310. Also, a bias current reference (e.g., a variable bias current reference) 340 (e.g., in the form of a variable current mirror reference 350) sets a common DC current (Idc) flowing through the stacked high-voltage signal amplifier 320. The voltage divider bias module 310 takes as an input the power supply voltage (VDD), and subsequently produces a plurality of control voltage biases (e.g., (N−1) VDD/N+Vtemp, (N−2)VDD/N+Vtemp, (N−3)VDD/N+Vtemp, (N−(N−2)VDD/N+Vtemp, VDD/N+Vtemp). Each control voltage bias comprises a voltage reference plus an offset voltage term (Vtemp). Each voltage reference is proportional to a division of the power supply voltage (VDD), and the offset voltage term (Vtemp) is proportional to temperature and is a function of process variation.

Then, the voltage buffer module 660 receives the plurality of control voltage biases. The voltage buffer module 660 generates a low impedance output from a high impedance input. Then, the voltage buffer module 660 outputs the plurality of control voltage biases.

The control voltage biases outputted from the voltage buffer module 660 then respectively bias the gate/base of the devices in the unit element amplifier cells 330 of stacked high-voltage signal amplifier 320 such that the gate-to-source voltage (Vgs) (or base-to-emitter voltage (Vbe)), as dependent on technology and is proportional to temperature (as is Vtemp), is cancelled. The net effect is that the stacked devices of the unit element amplifier cells 330 of the stacked high-voltage signal amplifier 320 have an evenly divided power supply voltage across each device drain-to-source voltage (Vds) (or collector-to-emitter voltage (Vce)), and the stacked devices' performance is independent of temperature.

Figure 7:
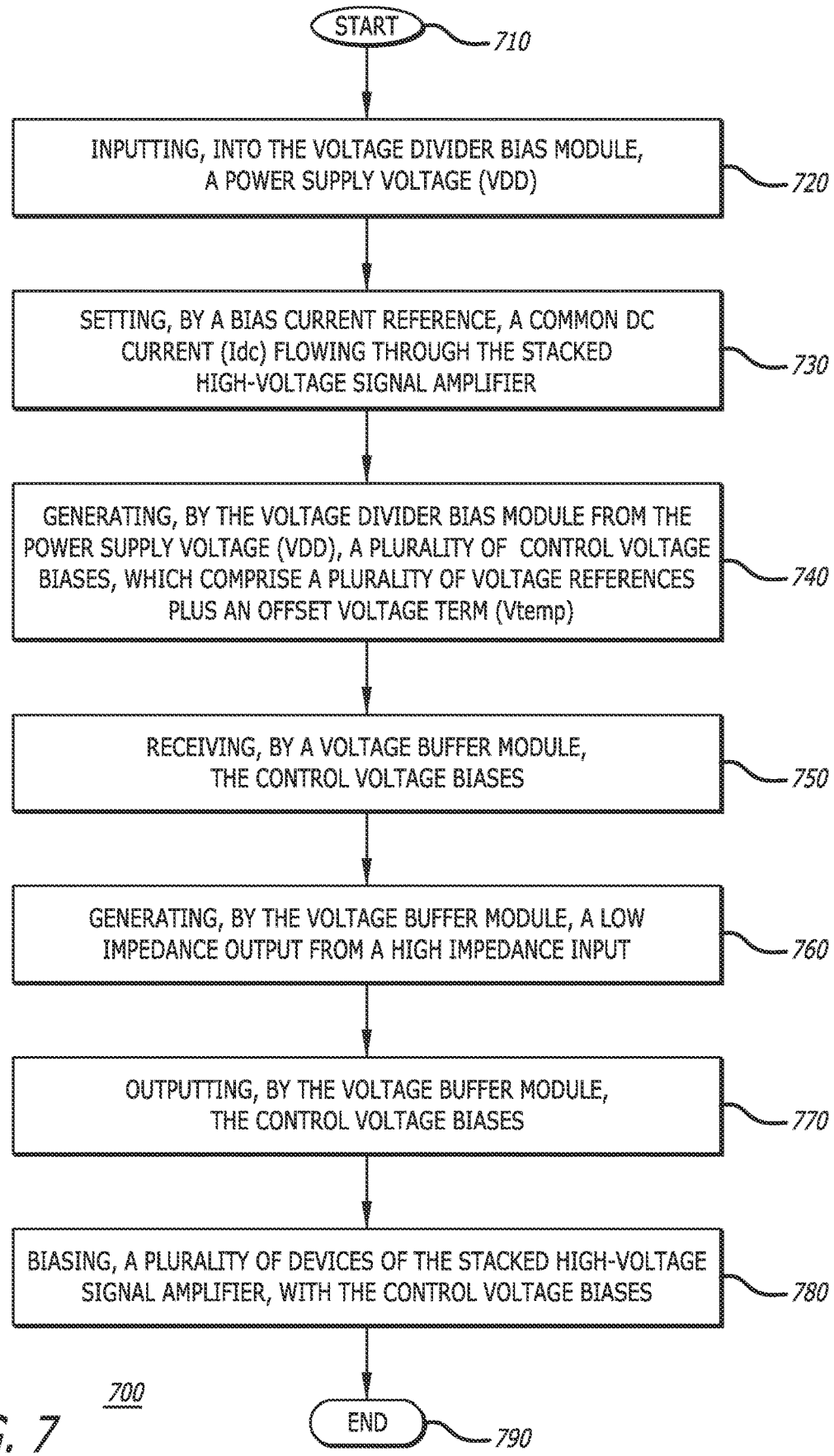
FIG. 7 is a flow chart showing the disclosed method for biasing the stacked high-voltage signal amplifier with the voltage divider bias module and the voltage buffer module of FIGS. 5 and 6, in accordance with at least one embodiment of the present disclosure.

FIG. 7 is a flow chart showing the disclosed method 700 for biasing the stacked high-voltage signal amplifier (refer to 320 of FIGS. 5 and 6) with the voltage divider bias module (refer to 310 of FIGS. 5 and 6) and the voltage buffer module (refer to 560 of FIG. 5, and refer to 660 of FIG. 6) of FIGS. 5 and 6, in accordance with at least one embodiment of the present disclosure. At the start 710 of the method 700, a power supply voltage (VDD) is inputted into the voltage divider bias module 720. A common DC current (Idc) flowing through the stacked high-voltage signal amplifier is also set 730. Then, the voltage divider bias module generates, from the power supply voltage (VDD), a plurality of control voltage biases, which comprise a plurality of voltage references plus an offset voltage term (Vtemp) 740. In one or more embodiments, the plurality of voltage references are each proportional to a division of the power supply voltage (VDD), and the offset voltage term (Vtemp) is proportional to temperature and is a function of process variation.

A voltage buffer module receives the control voltage biases 750. The voltage buffer module then generates a low impedance output from a high impedance input 760. The voltage buffer module then outputs the control voltage biases 770. Then, a plurality of devices of the stacked high-voltage signal amplifier is biased with the control voltage biases 780. Then, the method 700 ends 790.

Figure 8A:
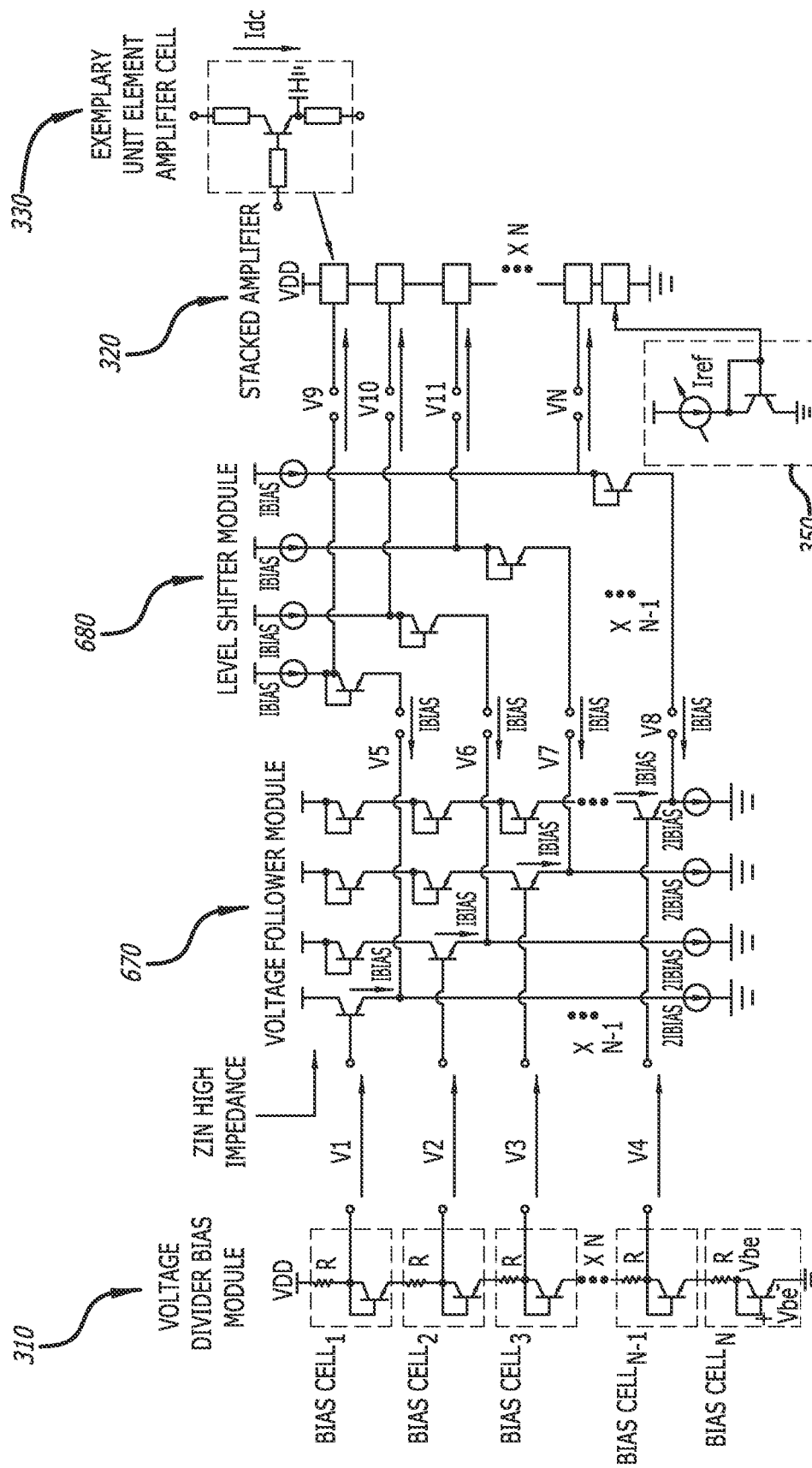
FIG. 8A is a detailed schematic circuit diagram of the disclosed system for biasing the stacked high-voltage signal amplifier with the voltage divider bias module and the voltage buffer module of FIG. 6, which employs a variable current mirror reference to generate a variable reference bias current, in accordance with at least one embodiment of the present disclosure.

FIG. 8A is a detailed schematic circuit diagram of the disclosed system 800 for biasing the stacked high-voltage signal amplifier 320 with the voltage divider bias module 310 and the voltage buffer module 660 of FIG. 6, which employs a variable current mirror reference 350 to generate a variable reference bias current (Idc), in accordance with at least one embodiment of the present disclosure. In this figure, the voltage buffer module 660 is implemented with BJT technology (e.g., SiGe BJTs), where the voltage buffer module 660 is formed from a voltage follower module 670 (e.g., refer to the voltage follower module 670 of FIG. 11) and a level shifter module 680 (e.g., refer to the level shifter module 680 of FIG. 12).

Figure 8B:
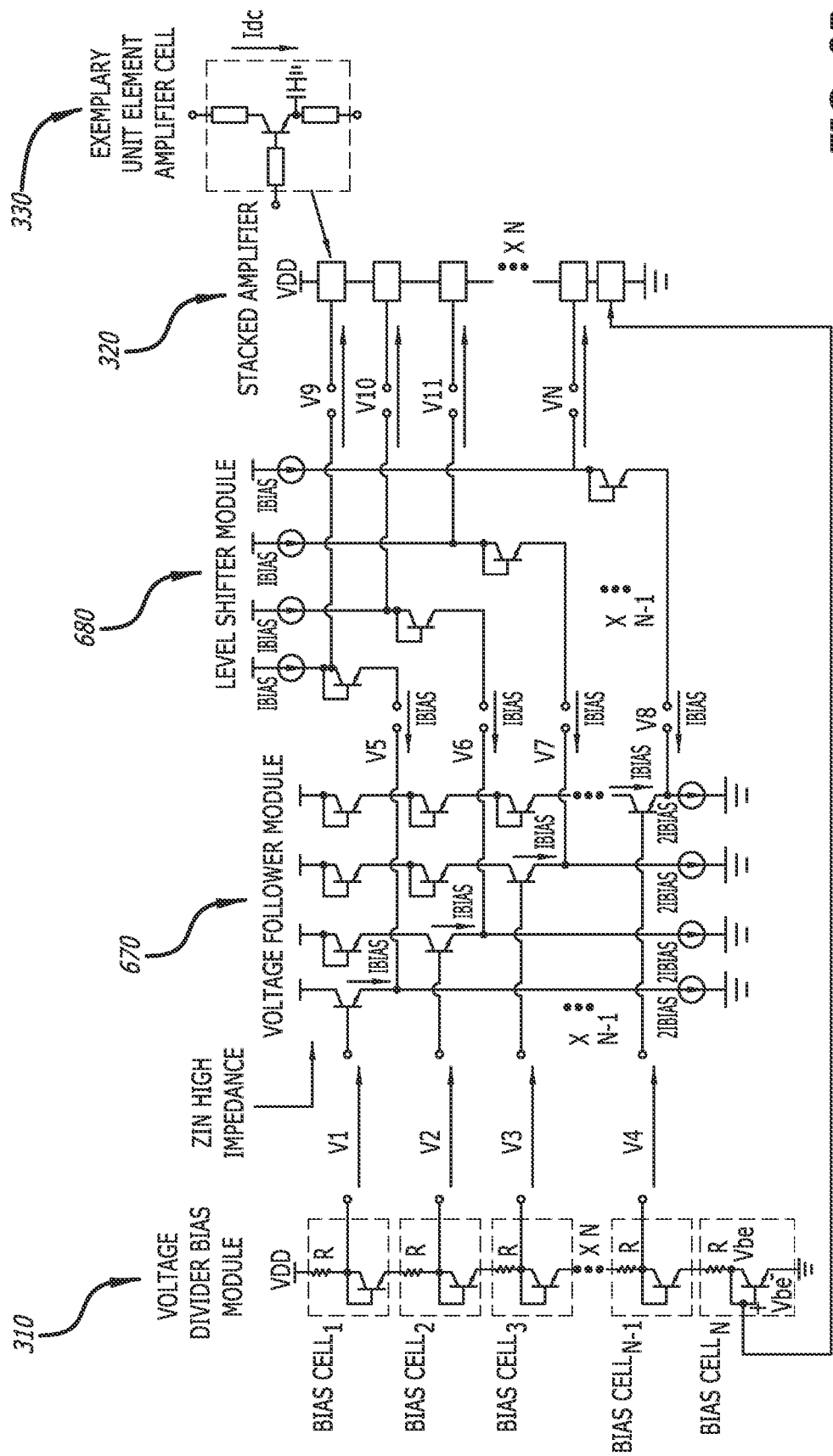
FIG. 8B is a detailed schematic circuit diagram of the disclosed system for biasing the stacked high-voltage signal amplifier with the voltage divider bias module and the voltage buffer module of FIG. 6, which utilizes current from the voltage divider bias module for the reference bias current, in accordance with at least one embodiment of the present disclosure.
Figure 11:
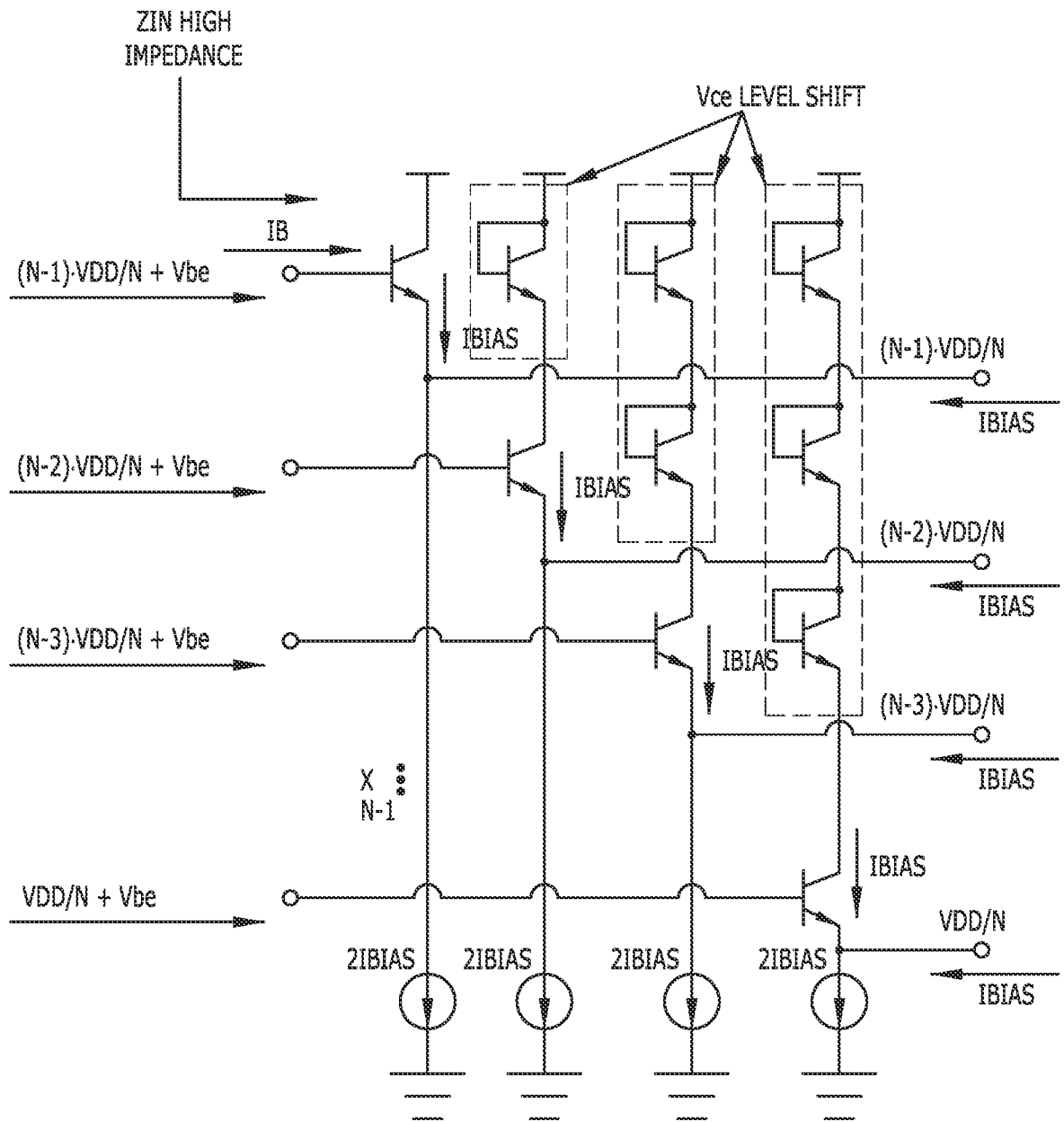
FIG. 11 is a detailed exemplary schematic circuit diagram of the voltage follower module of FIGS. 6, 8A, and 8B, in accordance with at least one embodiment of the present disclosure.
Figure 12:
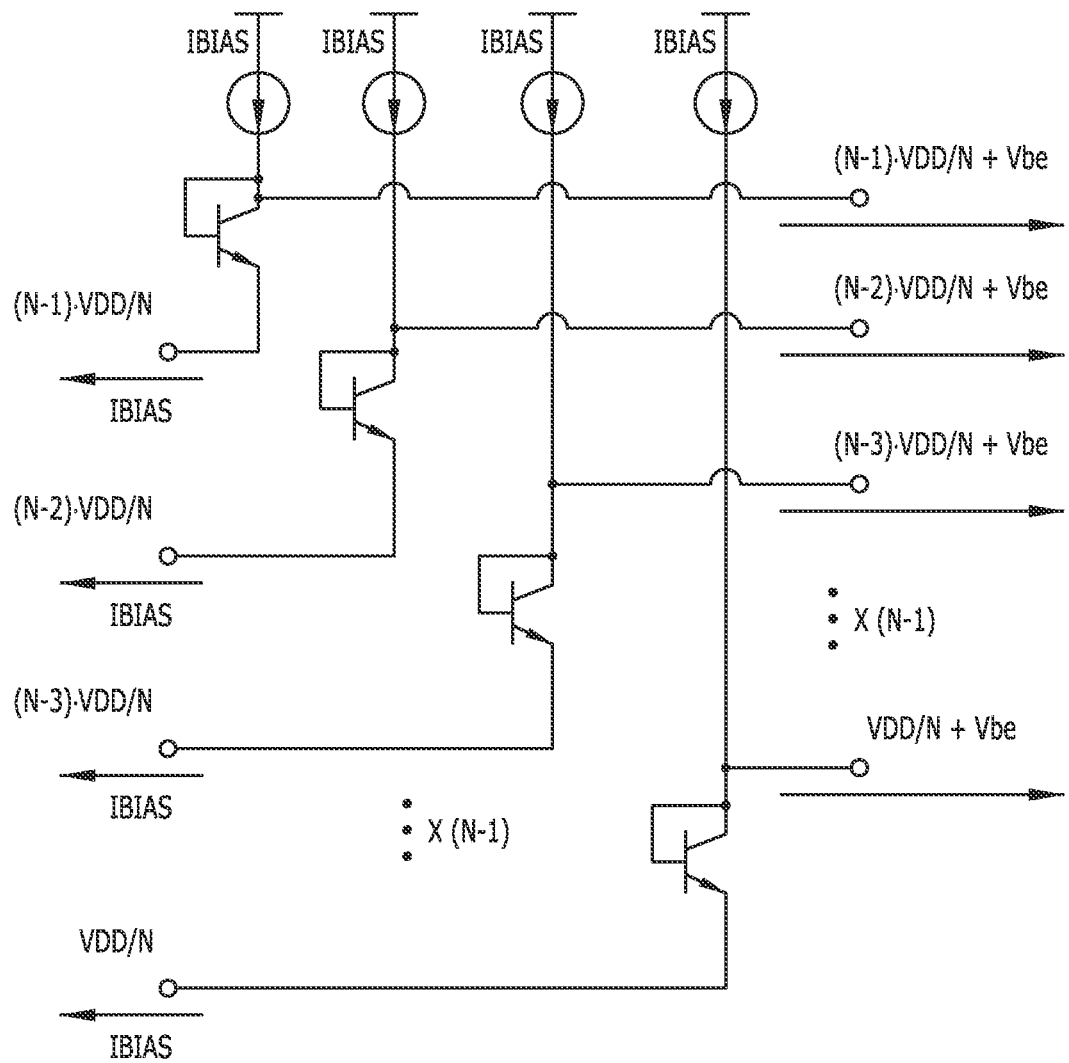
FIG. 12 is a detailed exemplary schematic circuit diagram of the level shifter module of FIGS. 6, 8A, and 8B, in accordance with at least one embodiment of the present disclosure.

In particular, FIG. 11 is a detailed exemplary schematic circuit diagram of the voltage follower module 670 of FIGS. 6, 8A, and 8B, in accordance with at least one embodiment of the present disclosure. And, FIG. 12 is a detailed exemplary schematic circuit diagram of the level shifter module 680 of FIGS. 6, 8A, and 8B, in accordance with at least one embodiment of the present disclosure. It should be noted that, in other embodiments, the voltage buffer module 660 (i.e. which includes the voltage follower module 670 and the level shifter module 680) may be implemented with other types of transistor technology (e.g., CMOS transistors or other types of BJTs) other than SiGe BJT transistors as is shown.

Referring to FIGS. 8A, 11, and 12, the voltage follower module 670 is created by "N−1" number of emitter followers with diode-connected loads to provide appropriate Vce/Vbe level shifting within each emitter follower to minimize Vce voltage reliability concerns. Each emitter follower has a current of Ibias plus an Ibias current from the next stage level shifter in the level shifter module 680, thereby creating a total current equating to a 2Ibias tail current source. The emitter follower outputs are then each level shifted by a diode-connected lever shifter of the level shifter module 680 to produce an output equal to a buffered output of the voltage divider bias module 310. With proper transistor device size and current density design, the temperature dependence of the Vbe of the emitter follower and the level shifter are cancelled, thereby the voltage buffer module 660 is itself temperature independent.

FIG. 8B is a detailed schematic circuit diagram of the disclosed system 850 for biasing the stacked high-voltage signal amplifier 320 with the voltage divider bias module 310 and the voltage buffer module 660 of FIG. 6, which utilizes current from the voltage divider bias module 310 for the reference bias current (Idc), in accordance with at least one embodiment of the present disclosure. The system 850 of FIG. 8B is similar to the system 800 of FIG. 8A, except that the variable current mirror reference 350 is removed, and the device of last temperature-dependent resistive cell (i.e. Bias Cell$_N$, refer to 910e of FIG. 9) of the voltage bias module 310 is connected to the last unit element amplifier cell 330 in the stacked high-voltage signal amplifier 320. This connection allows for the current from the device of last temperature-dependent resistive cell (i.e. Bias Cell$_N$, refer to 910e of FIG. 9) of the voltage bias module 310 to provide the reference bias current (Idc) for the stacked high-voltage signal amplifier 320.

FIG. 9 is detailed exemplary schematic circuit diagram of the voltage bias divider module 310 of FIGS. 5, 6, 8A, and 8B, in accordance with at least one embodiment of the present disclosure. As previously mentioned above, the voltage divider bias module 310 comprises a plurality of temperature-dependent resistive cells (e.g., Bias Cell$_1$ 910a, Bias Cell$_2$ 910b, Bias Cell$_3$ 910c, Bias Cell$_4$ 910d, Bias Cell$_5$ 910e) connected together in series and sharing a common direct current (DC). Each temperature-dependent resistive cell 910a, 910b, 910c, 910d, 910e comprises a diode-connected device connected to a resistor R in series.

Figure 10:
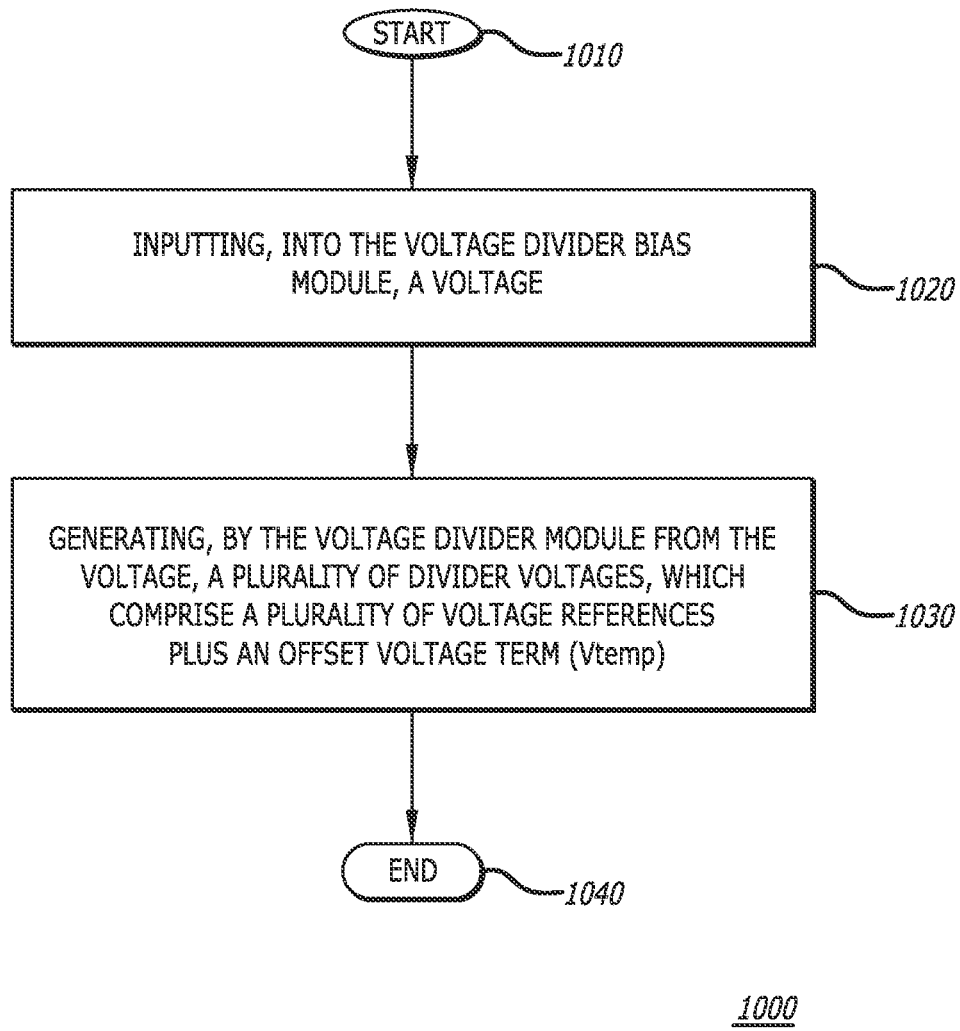
FIG. 10 is a flow chart showing the disclosed method for generating an equal division of a voltage with a voltage divider module (e.g., the voltage bias divider module of FIG. 9), in accordance with at least one embodiment of the present disclosure.

In one or more embodiments, the voltage bias divider module 310 of FIG. 2 may be employed for simply generating an equal division of voltage, which may be utilized for a number of various different applications. FIG. 10 is a flow chart showing the disclosed method 1000 for generating an equal division of a voltage with a voltage divider module (e.g., the voltage bias divider module 310 of FIG. 9), in accordance with at least one embodiment of the present disclosure. At the start 1010 of the method 1000, a voltage is inputted into the voltage divider bias module 1020. Then, the voltage divider module generates, from the voltage, a plurality of divider voltages, which comprise a plurality of voltage references plus an offset voltage term (Vtemp) 1030. In one or more embodiments, the plurality of voltage references are each proportional to a division of the voltage, and the offset voltage term (Vtemp) is proportional to temperature and is a function of process variation. Then, the method 1000 ends 1040.

Figure 13:
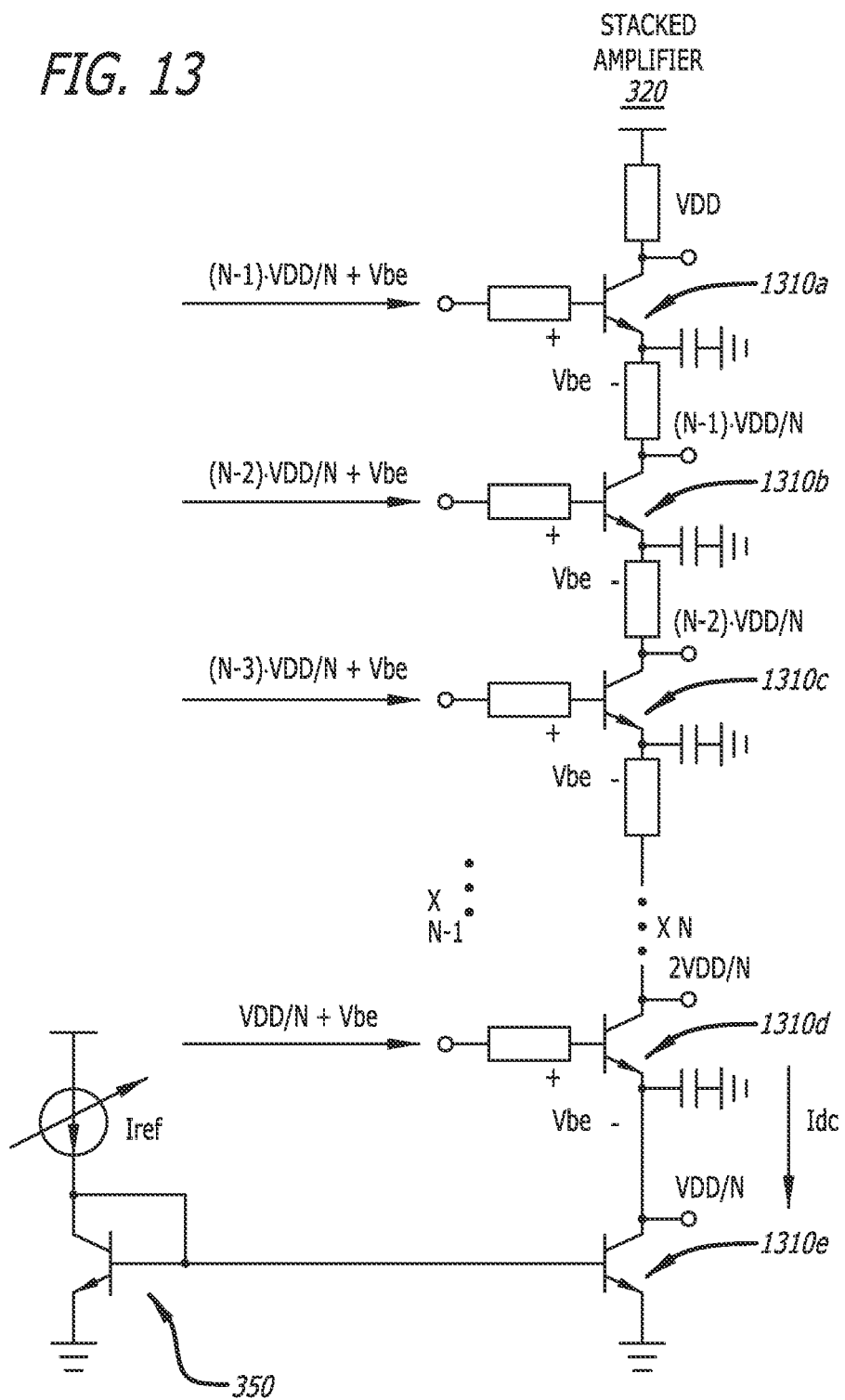
FIG. 13 is a detailed exemplary schematic circuit diagram of the stacked high-voltage signal amplifier of FIGS. 3, 5, 6, 8A, and 8B, in accordance with at least one embodiment of the present disclosure.

FIG. 13 is a detailed exemplary schematic circuit diagram of the stacked high-voltage signal amplifier 320 of FIGS. 3, 5, 6, 8A, and 8B, in accordance with at least one embodiment of the present disclosure. In the figure, the stacked high-voltage signal amplifier 320 is shown to comprise a plurality of devices 1310a, 1310b, 1310c, 1310d, 1310e. For the disclosed system, the RF signal flow of the stacked high-voltage signal amplifier 320 may take any form among single-stage to multi-stage architectures or various forms of power combining architectures. However, a commonality among all stacked high-voltage signal amplifiers 320 that may be implemented with the disclosed voltage divider bias module 310 is that the devices 1310a, 1310b, 1310c, 1310d, 1310e of the stacked high-voltage signal amplifier 320 are stacked in a DC cascode configuration sharing a common DC current (Idc).

FIGS. 14 and 15 together show an exemplary circuit diagram for the disclosed system for biasing a stacked high-voltage signal amplifier 1500 with a bias circuit 1400, in accordance with at least one embodiment of the present disclosure. In particular, FIG. 14 is an exemplary circuit diagram for a bias circuit 1400 for the disclosed system for biasing a stacked high-voltage signal amplifier with a voltage divider bias module, in accordance with at least one embodiment of the present disclosure. In this figure, an exemplary bias circuit 1400 that may be used to bias a three-stacked device power amplifier (PA) is shown. And, FIG. 15 is an exemplary circuit diagram for a stacked high-voltage signal amplifier 1500 comprising two stages (i.e. stage 1 and stage 2) that may be biased by the bias circuit 1400 of FIG. 14, in accordance with at least one embodiment of the present disclosure. In this figure, an exemplary stacked high-voltage signal amplifier 1500 that comprises two stages is shown, where the first stage (stage 1) comprises a common emitter amplifier and the second stage (stage 2) comprises a cascode amplifier.

FIGS. 16-22 show simulation and measured results of the exemplary circuit diagram of the disclosed system for biasing a stacked high-voltage signal amplifier 1500 with the bias circuit 1400 of FIGS. 14 and 15.

In particular, FIG. 16 is a graph 1600 showing simulated results of how the DC current (Idc) of the stacked high-voltage signal amplifier 1500 of FIG. 15 varies as the bias current (Ibias) is varied; FIG. 17 is a graph 1700 showing simulated results of how the voltage Ve$_3$ of the stacked high-voltage signal amplifier 1500 of FIG. 15 varies as the bias current (Ibias) is varied; and FIG. 18 is a graph 1800 showing simulated results of how the voltage Ve$_2$ of the stacked high-voltage signal amplifier 1500 of FIG. 15 varies as the bias current (Ibias) is varied. As shown in graphs 1600, 1700, 1800 of FIGS. 16, 17, and 18, the stacked high-voltage signal amplifier's 1500 main current may be swept over a wide range (e.g., by sweeping (bias of the bias circuit 1400), and yet the voltages across each device Vce of the stacked high-voltage signal amplifier 1500 remain approximately constant.

FIG. 19 is a graph 1900 showing a simulation comparison between biasing a stacked high-voltage signal amplifier (e.g., 1500 of FIG. 15) with the proposed bias circuit 1400 of FIG. 14 and with a conventional biasing scheme (e.g., the traditional resistive divider biasing as shown in FIG. 1A, 1B, or 2). The simulation results illustrate that with a wide range of temperature, the conventional biasing scheme produces output voltages of the signal amplifier that vary, while the proposed bias circuit 1400 produces constant output voltages of the signal amplifier versus temperature.

The disclosed circuit comprising the bias circuit 1400 of FIG. 14 and the stacked high-voltage signal amplifier 1500 of FIG. 15 was fabricated for testing purposes. The disclosed circuit was fabricated in a ninety (90) nanometer (nm) SiGe process (with an active area of 400 micrometers (µm)×400 µm). To conserve active area, the bias circuit 1400 was contained below metal five (5), and was placed underneath the upper metal layer stub matching networks with metal 5 reserved as an isolating shield. A 3.0 Volt VDD supply was divided evenly across the devices of the stacked high-voltage signal amplifier 1500 limiting the output swing below the safe operating area (SOA) limit, thereby ensuring minimal performance degradation over a mission lifecycle, as a trade-off for moderate saturated output power (P$_{SAT}$) and power added efficiency (PAE). FIG. 20 is a graph 2000 showing the simulated output current density (Jc) of the stacked high-voltage signal amplifier 1500 of FIG. 15 as the Vce power is varied (from Pin=−30 decibel-milliwatts (dBm) to −12.5 dBm) for the stacked high-voltage signal amplifier 1500 of FIG. 15.

FIG. 21 is a graph 2100 showing the simulated and measured S-parameters (in decibels (dB)) as the frequency (in Hertz (Hz)) is varied for the stacked high-voltage signal amplifier 1500 of FIG. 15. In this figure, the measured small signal gain shows high gain above 20 decibels (dB) due to the two-stage cascode architecture of the stacked high-voltage signal amplifier 1500 of FIG. 15.

FIG. 22 is a graph 2200 showing the simulated and measured gain (in dB), power added efficiency (PAE) (in percentage (%)), and output power (Pout) (in dBm) as the input power (Pin) (in dBm) is varied for the stacked high-voltage signal amplifier 1500 of FIG. 15. In this figure, a moderate saturated output power (P$_{SAT}$) of +6.5 dBm and peak PAE of 11% is shown, constrained by the safe-operating region life cycle voltage swing.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for biasing a stacked high-voltage signal amplifier, the method comprising:
    generating, by a voltage divider bias module from a power supply voltage, a plurality of control voltage biases,
    wherein the plurality of control voltage biases comprise a plurality of voltage references plus an offset voltage term,
    wherein the plurality of voltage references are each proportional to a division of the power supply voltage, and wherein the offset voltage term is proportional to temperature and is a function of process variation; and
    biasing, with the plurality of control voltage biases, a plurality of devices of the stacked high-voltage signal amplifier.

2. The method of claim 1, wherein the voltage divider bias module comprises a plurality of temperature-dependent resistive cells connected together in series and sharing a common direct current, and
    wherein each of the plurality of temperature-dependent resistive cells comprises a diode-connected device connected to a resistor in series.

3. The method of claim 2, wherein the diode-connected device is one of a transistor or other three-terminal amplifying device.

4. The method of claim 3, wherein the transistor is one of a bipolar junction transistor (BJT) or a complementary metal-oxide semiconductor (CMOS) transistor.

5. The method of claim 1, wherein the method further comprises inputting, into the voltage divider bias module, the power supply voltage.

6. The method of claim 1, wherein the offset voltage term is equal to one of a base-to-emitter voltage or a gate-to-source voltage for each of the devices of the stacked high-voltage signal amplifier.

7. The method of claim 1, wherein the stacked high-voltage signal amplifier comprises a plurality of unit element amplifier cells that are stacked such that the plurality of unit element amplifier cells share a common direct current.

8. The method of claim 7, wherein the plurality of unit element amplifier cells are connected together in a cascode configuration.

9. The method of claim 1, wherein the stacked high-voltage signal amplifier comprises at least one stage.

10. The method of claim 7, wherein each unit element amplifier cell comprises one of a transistor or other three-terminal amplifying device.

11. The method of claim 10, wherein the transistor is one of a bipolar junction transistor (BJT) or a complementary metal-oxide semiconductor (CMOS) transistor.

12. The method of claim 1, wherein the plurality of devices in the stacked high-voltage signal amplifier have a same temperature coefficient of a threshold voltage as devices in the voltage divider bias module.

13. The method of claim 1, wherein the plurality of devices in the stacked high-voltage signal amplifier are of a same type with a same current density as devices in the voltage divider bias module.

14. The method of claim 1, wherein the method further comprises setting, by a bias current reference, a common direct current flowing through the stacked high-voltage signal amplifier.

15. The method of claim 14, wherein the bias current reference is a variable bias current reference.

* * * * *